(12) United States Patent
Maekawa

(10) Patent No.: US 11,601,608 B2
(45) Date of Patent: Mar. 7, 2023

(54) PHOTOELECTRIC CONVERSION APPARATUS, PHOTOELECTRIC CONVERSION SYSTEM, AND MOVING BODY

(71) Applicant: CANON KABUSHIKI KAISHA, Tokyo (JP)

(72) Inventor: Shintaro Maekawa, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 412 days.

(21) Appl. No.: 16/937,458

(22) Filed: Jul. 23, 2020

(65) Prior Publication Data

US 2021/0037203 A1 Feb. 4, 2021

(30) Foreign Application Priority Data

Jul. 29, 2019 (JP) .............................. JP2019-139134

(51) Int. Cl.
| | |
|---|---|
| *H04N 5/3745* | (2011.01) |
| *H01L 27/146* | (2006.01) |
| *H04N 5/369* | (2011.01) |
| *H04N 5/351* | (2011.01) |
| *G01S 17/08* | (2006.01) |
| *G01S 7/4863* | (2020.01) |
| *H01L 23/00* | (2006.01) |

(52) U.S. Cl.
CPC ......... *H04N 5/3745* (2013.01); *G01S 7/4863* (2013.01); *G01S 17/08* (2013.01); *H01L 24/08* (2013.01); *H01L 27/14621* (2013.01); *H01L 27/14634* (2013.01); *H01L 27/14645* (2013.01); *H04N 5/351* (2013.01); *H04N 5/379* (2018.08); *H01L 2224/08145* (2013.01)

(58) Field of Classification Search
CPC ...... H04N 5/3745; H04N 5/379; H04N 5/351; G01S 7/4863; G01S 17/08; H01L 24/08; H01L 27/14621; H01L 27/14634; H01L 27/14645; H01L 2224/08145
USPC .......................................................... 348/135
See application file for complete search history.

(56) References Cited

U.S. PATENT DOCUMENTS

| | | | |
|---|---|---|---|
| 9,176,361 B2 * | 11/2015 | Sartor | ................... H03M 1/361 |
| 2015/0163429 A1 | 6/2015 | Dai | |
| 2019/0018117 A1 | 1/2019 | Perenzoni | |
| 2020/0137373 A1 * | 4/2020 | Iguchi | ...................... G01C 3/06 |

FOREIGN PATENT DOCUMENTS

JP 2019-75610 A 5/2019

* cited by examiner

*Primary Examiner* — Allen C Wong
(74) *Attorney, Agent, or Firm* — Canon U.S.A., Inc. IP Division

(57) ABSTRACT

A photoelectric conversion apparatus includes one or more first avalanche diodes, a first processing circuit configured to be connected to the first avalanche diode(s), one or more second avalanche diodes, and a second processing circuit configured to be connected to the second avalanche diode(s), wherein the first avalanche diode(s) is/are configured to be connected to the second processing circuit by a selection circuit.

22 Claims, 16 Drawing Sheets

FIG.14B
FRONT VIEW
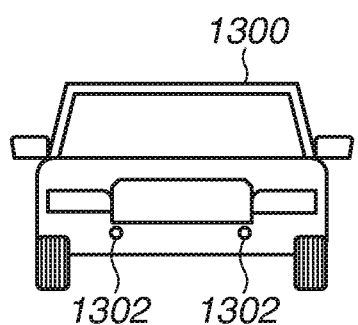
TOP VIEW
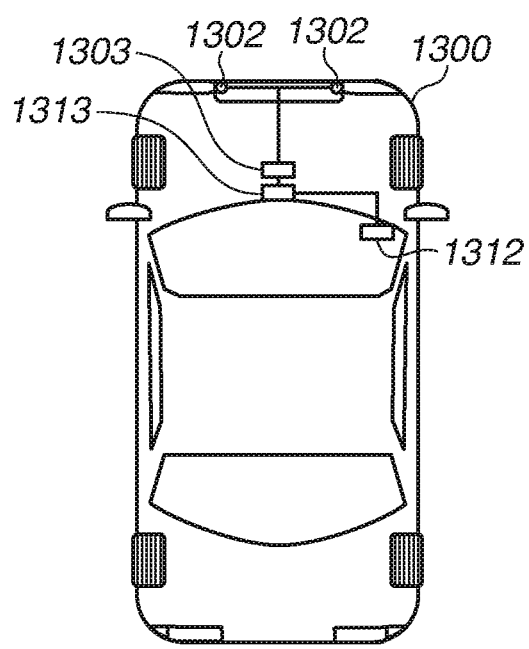
REAR VIEW
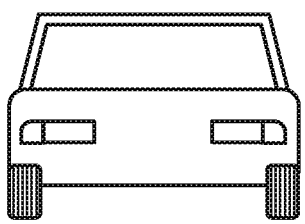

PHOTOELECTRIC CONVERSION APPARATUS, PHOTOELECTRIC CONVERSION SYSTEM, AND MOVING BODY

BACKGROUND

Field

The present disclosure relates to a photoelectric conversion apparatus, a photoelectric conversion system, and a moving body.

Description of the Related Art

A photoelectric conversion apparatus that digitally counts the number of photons arriving at a light reception unit and outputs a count value as a digital signal from a pixel has been known. United States Patent Application Publication No. 2015/0163429 discusses an imaging apparatus including a plurality of single-photon avalanche diode (SPAD) regions and a plurality of digital counters. United States Patent Application Publication No. 2015/0163429 also discusses reception of output pulses generated based on photons received at the SPAD regions by the digital counters.

According to United States Patent Application Publication No. 2015/0163429, the photons received at an SPAD region are only connected to a corresponding digital counter. This means poor versatility.

SUMMARY

According to an aspect of the present disclosure, a photoelectric conversion apparatus includes one or more first avalanche diodes, a first processing circuit configured to be connected to the first avalanche diode(s), one or more second avalanche diodes, and a second processing circuit configured to be connected to the second avalanche diode(s). The first avalanche diode(s) is/are configured to be connected to the second processing circuit by a selection circuit. The second avalanche diode(s) is/are configured to be connected to the first processing circuit by the selection circuit. A signal from the second avalanche diode(s) is not input to either of the first and second processing circuits in a period where a signal from the first avalanche diode(s) is read into the second processing circuit.

Further features of the disclosure will become apparent from the following description of exemplary embodiments with reference to the attached drawings.

BRIEF DESCRIPTION OF THE DRAWINGS

FIGS. 14A and 14B are schematic diagrams illustrating a photoelectric conversion system and a moving body according to a seventh exemplary embodiment.

DESCRIPTION OF THE EMBODIMENTS

Figure 1:
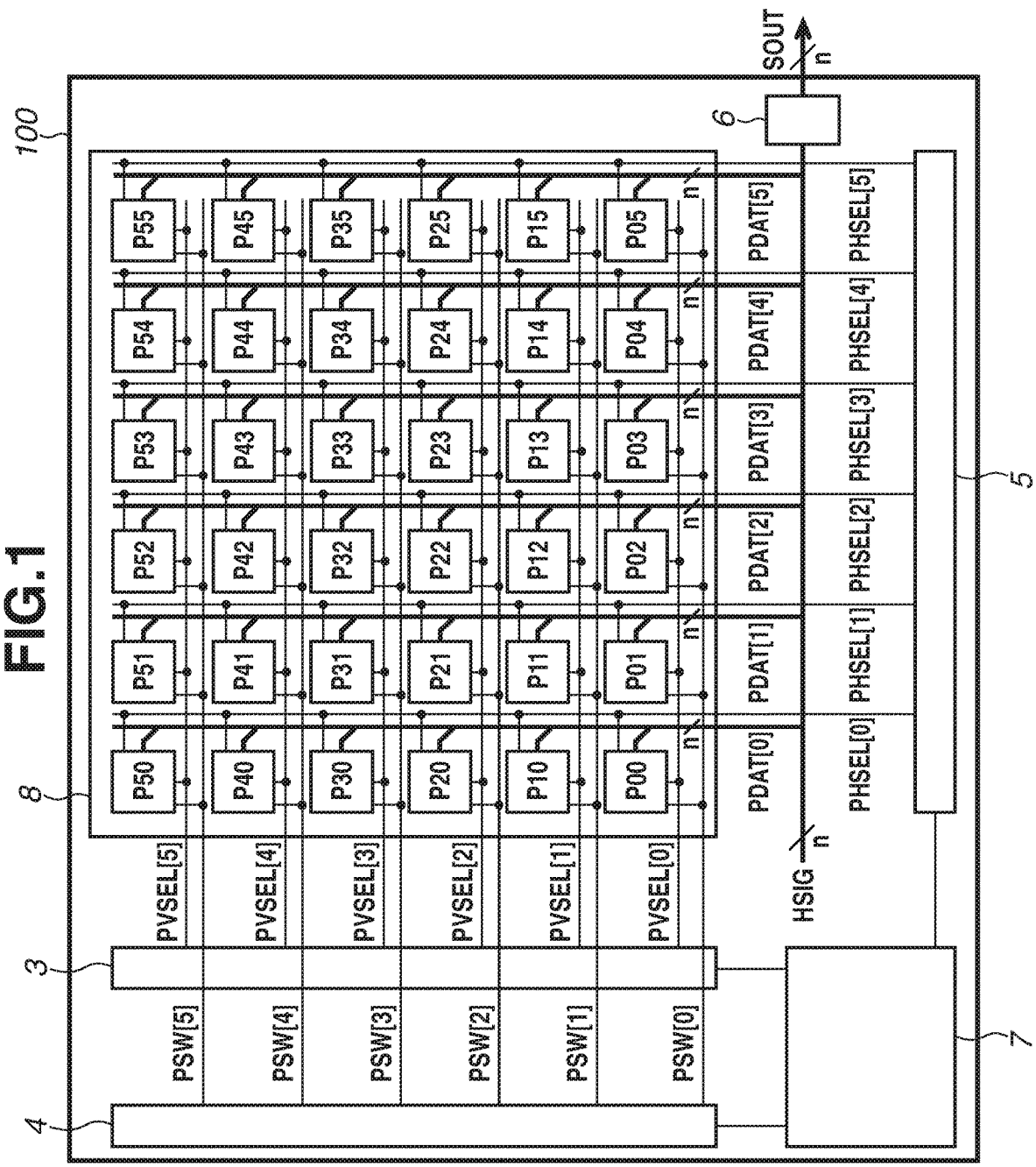
FIG. 1 is a block diagram schematically illustrating a configuration of a photoelectric conversion apparatus according to a first exemplary embodiment.
Figure 2:
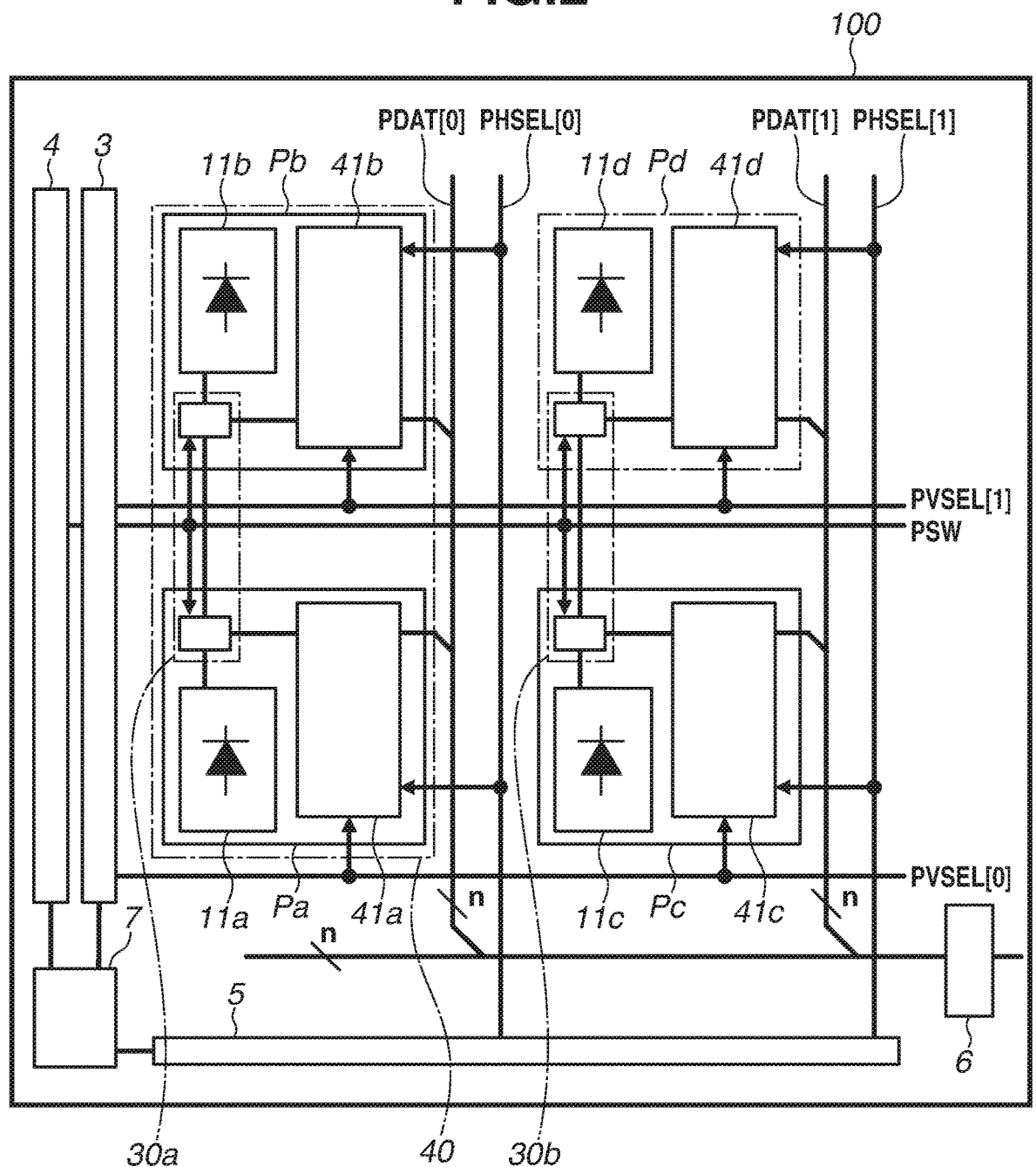
FIG. 2 is a diagram schematically illustrating a configuration of the photoelectric conversion apparatus according to the first exemplary embodiment.
Figure 3:
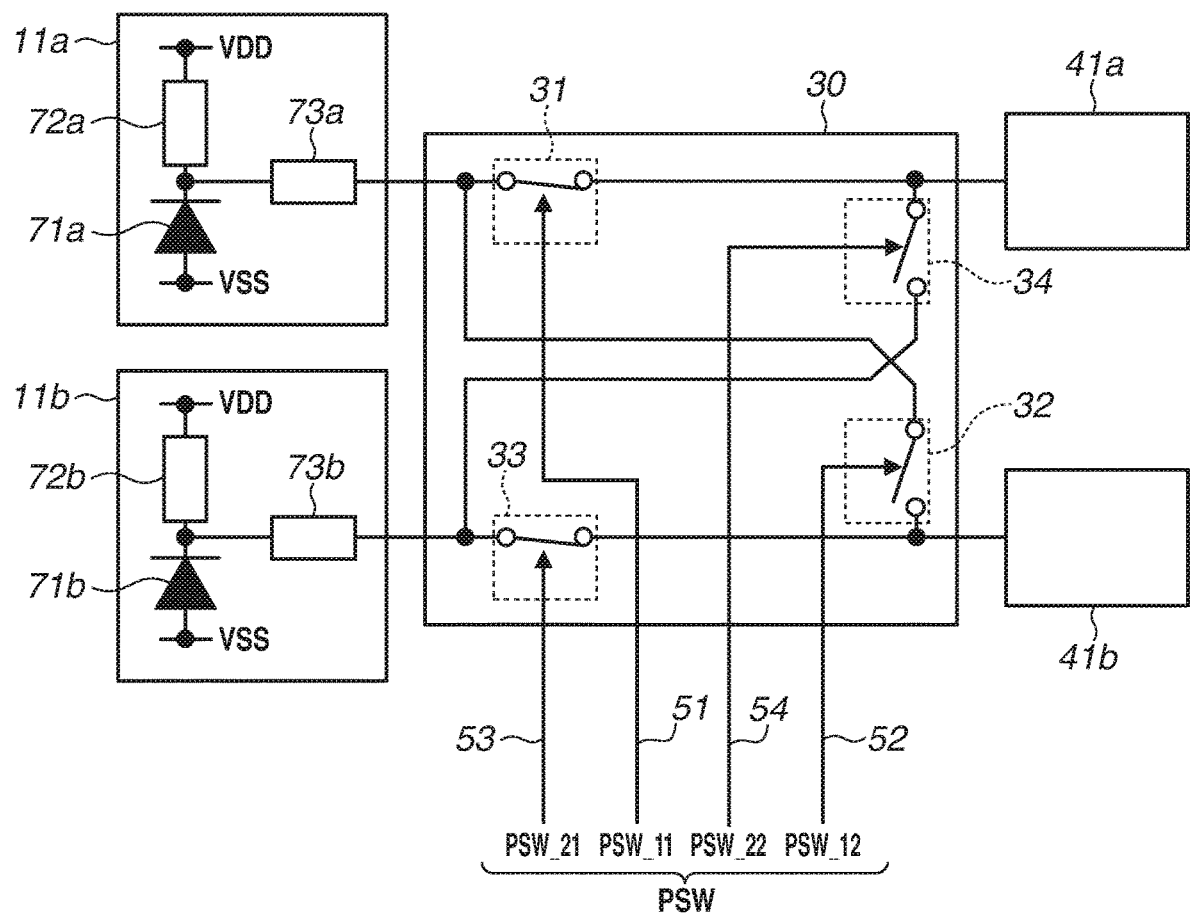
FIG. 3 is an equivalent circuit diagram illustrating a configuration example of pixels in the photoelectric conversion apparatus according to the first exemplary embodiment.
Figure 4:
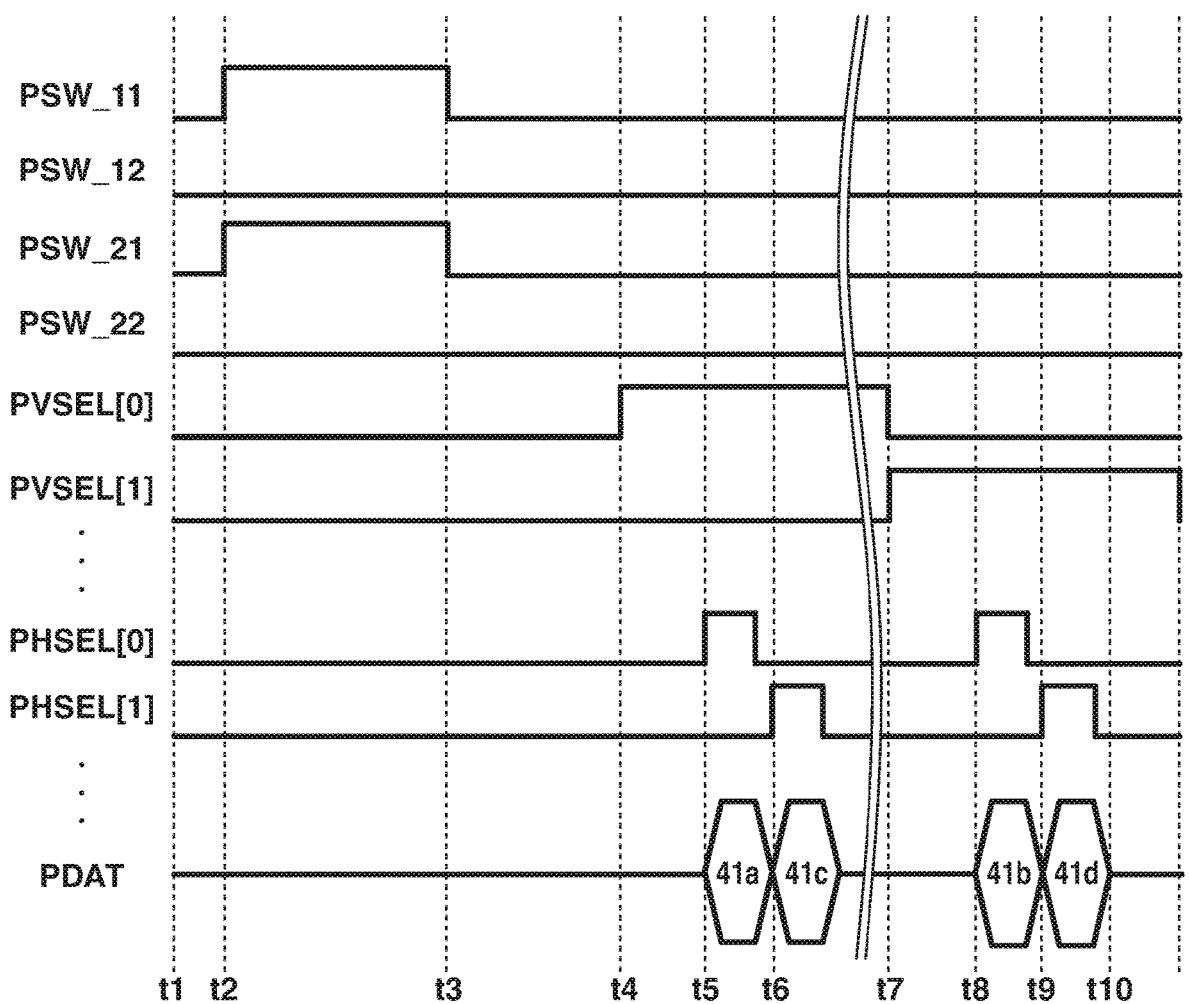
FIG. 4 is a timing chart in an operation mode of the photoelectric conversion apparatus according to the first exemplary embodiment.
Figure 5:
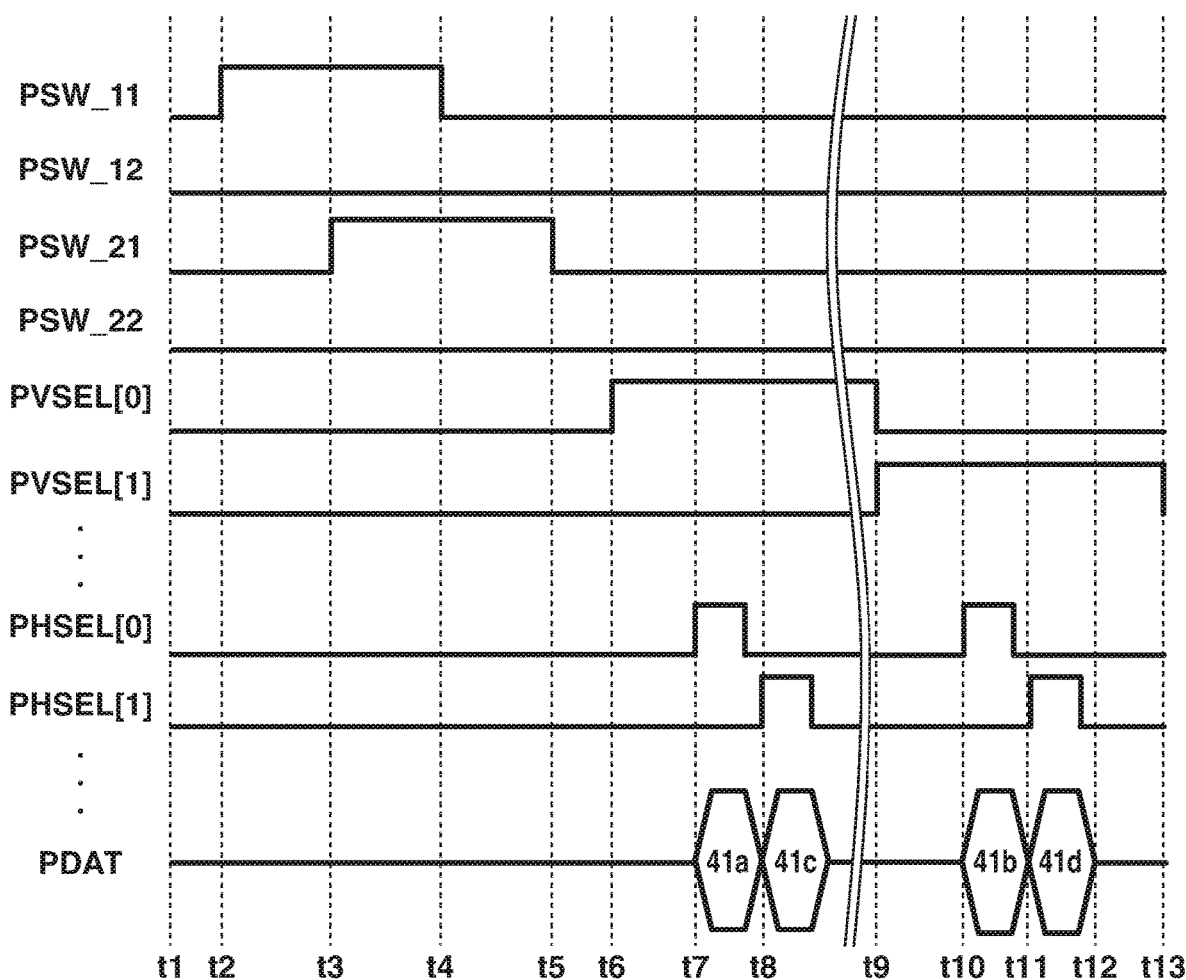
FIG. 5 is a timing chart in an operation mode of the photoelectric conversion apparatus according to the first exemplary embodiment.
Figure 6:
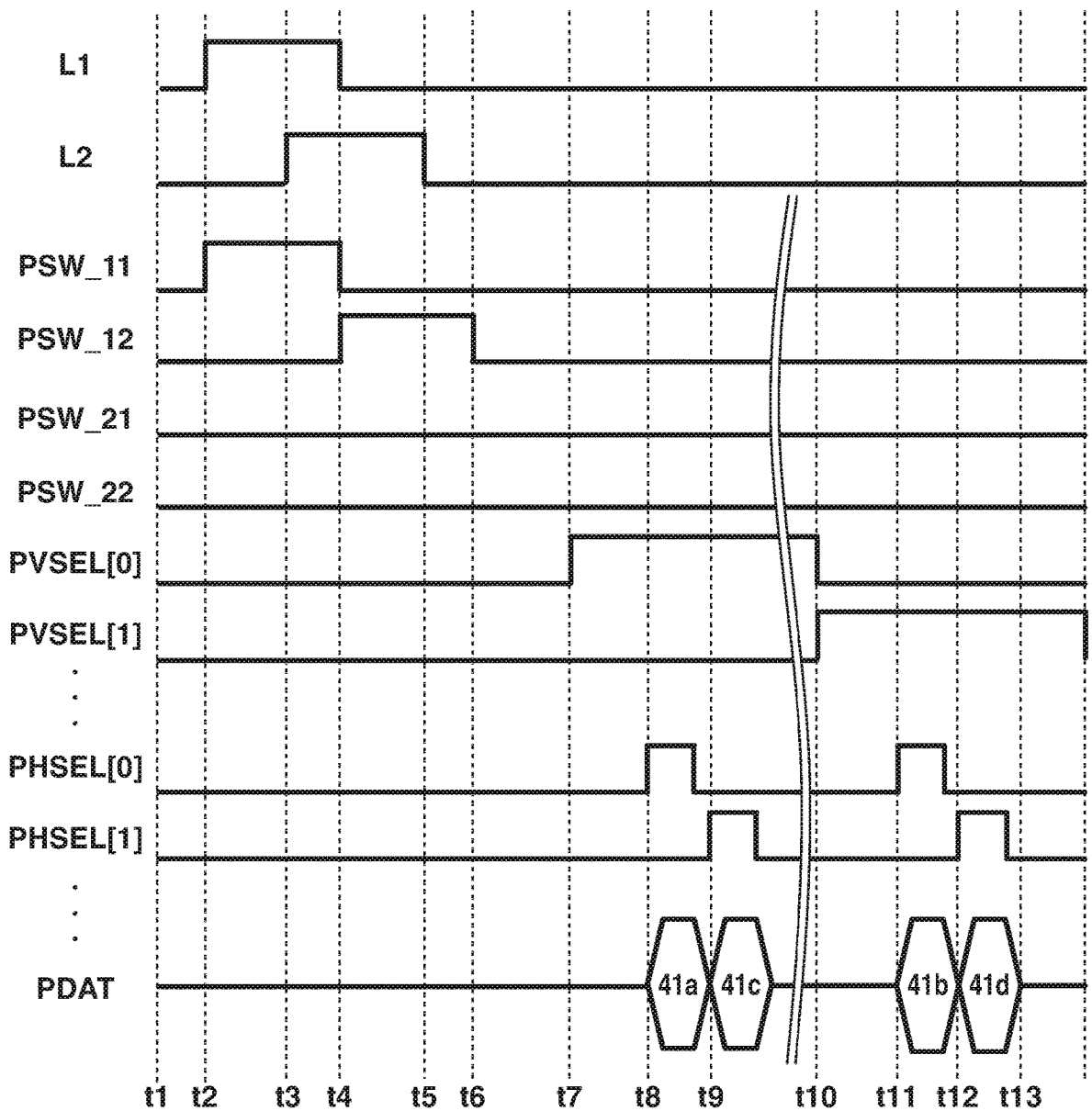
FIG. 6 is a timing chart in an operation mode of the photoelectric conversion apparatus according to the first exemplary embodiment.
Figure 7:
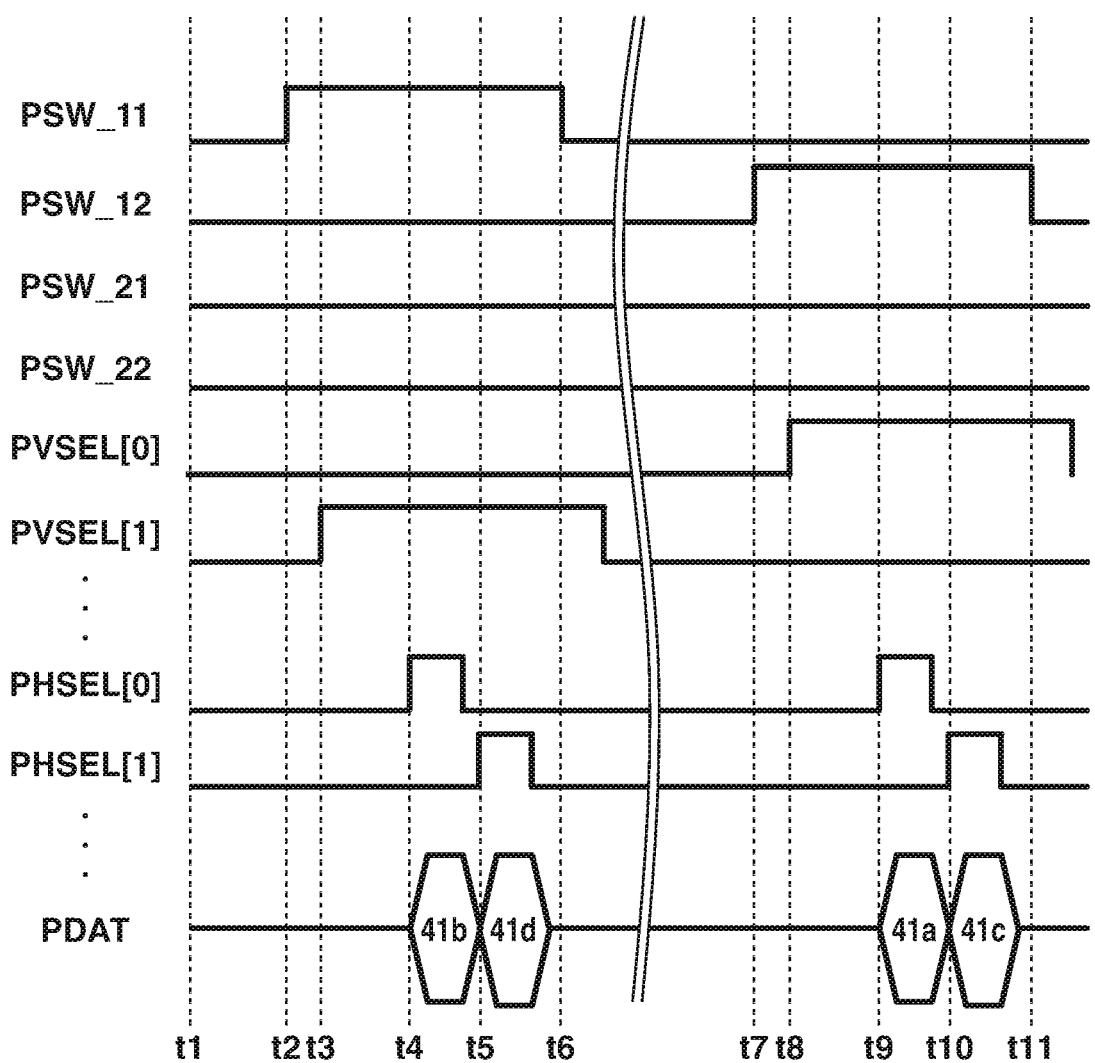
FIG. 7 is a timing chart in an operation mode of the photoelectric conversion apparatus according to the first exemplary embodiment.

A photoelectric conversion apparatus according to a first exemplary embodiment will be described with reference to FIGS. 1 to 7. FIG. 1 is a block diagram schematically illustrating a configuration of the photoelectric conversion apparatus according to the present exemplary embodiment. FIG. 2 is a diagram schematically illustrating a configuration of pixels in the photoelectric conversion apparatus according to the present exemplary embodiment. FIG. 3 is an equivalent circuit diagram illustrating a configuration example of pixels in the photoelectric conversion apparatus according to the present exemplary embodiment. FIG. 4 is a timing chart in a first imaging mode of the photoelectric conversion apparatus according to the present exemplary embodiment. FIG. 5 is a timing chart in a second imaging mode of the photoelectric conversion apparatus according to the present exemplary embodiment. FIG. 6 is a timing chart in a distance measurement mode of the photoelectric conversion apparatus according to the present exemplary embodiment. FIG. 7 is a timing chart in a global shutter operation mode of the photoelectric conversion apparatus according to the present exemplary embodiment.

As illustrated in FIG. 1, a photoelectric conversion apparatus 100 according to the present exemplary embodiment includes a pixel area 8, a vertical selection circuit 3, a selection signal supply circuit 4, a horizontal selection circuit 5, an output circuit 6, and a control circuit 7.

The pixel area 8 includes a plurality of unit pixels P arranged in a matrix with a plurality of rows and a plurality of columns. FIG. 1 illustrates 36 unit pixels P arranged in six rows from zeroth to fifth rows, and six columns from zeroth to fifth columns along with numerals indicating the row and column numbers. For example, a unit pixel P in the first row and the fourth column is denoted by the reference symbol P14. The numbers of rows and columns of the pixel array constituting the pixel area 8 are not limited in particular.

Control lines PVSEL extending in a first direction (in FIG. 1, horizontal direction) are laid in the respective rows of the pixel array in the pixel area 8. The control lines PVSEL are connected to the respective unit pixels P arranged in the first direction and serve as common signal lines for the unit pixels P. The first direction in which the control lines PVSEL extend may also be referred to as a row direction or horizontal direction. In FIG. 1, the control lines PVSEL are illustrated with numerals indicating the row numbers. For example, a control line PVSEL in the first row is denoted by the reference symbol PVSEL[1].

The control lines PVSEL in respective rows are connected to the vertical selection circuit 3. The vertical selection circuit 3 is a circuit unit that supplies a control signal for driving a signal generation circuit (not illustrated) in each of the unit pixels P to the unit pixels P via the control lines PVSEL.

Output lines PDAT extending in a second direction (in FIG. 1, vertical direction) crossing the first direction are laid in the respective columns of the pixel array in the pixel area 8. The output lines PDAT are connected to the respective unit pixels P arranged in the second direction and serve as common signal lines for the unit pixels P. The second direction in which the output lines PDAT extend may also be referred to as a column direction or vertical direction. In FIG. 1, the output lines PDAT are illustrated with numerals indicating the column numbers. For example, an output line PDAT in the fourth column is denoted by the reference symbol PDAT[4]. Each of the output lines PDAT includes n signal lines for outputting an n-bit digital signal.

The output lines PDAT are connected to the output circuit 6. The output lines PDAT output the signals output from the unit pixels P connected to the corresponding columns via the output lines PDAT. The signals output from the unit pixels P constitute an n-bit digital signal input to the output circuit 6 via the n signal lines of the respective output lines PDAT.

The horizontal selection circuit 5 is a circuit unit that supplies control signals for reading signals from the unit pixels P to the respective unit pixels P. The horizontal selection circuit 5 supplies the control signals to the unit pixels P in the columns via respective control lines PHSEL. The unit pixels P having received the control signals from the horizontal selection circuit 5 output signals to the output circuit 6 via a horizontal output line HSIG. In FIG. 1, the control lines PHSEL are illustrated with numerals indicating the column numbers. For example, a control line PHSEL in the fourth column is denoted by the reference symbol PHSEL[4]. The horizontal output line HSIG includes n signal lines for outputting an n-bit digital signal.

The output circuit 6 is a circuit unit for outputting the signal supplied via the horizontal output line HSIG as an output signal SOUT to outside the photoelectric conversion apparatus 100. The control circuit 7 is a circuit unit for supplying control signals for controlling operation of the vertical selection circuit 3, the selection signal supply circuit 4, the horizontal selection circuit 5, and the output circuit 6, and timing of the operation thereof. At least some of the control signals for controlling the operation of the vertical selection circuit 3, the selection signal supply circuit 4, the horizontal selection circuit 5, and the output circuit 6, and the timing of the operation thereof may be supplied from outside the photoelectric conversion apparatus 100.

As illustrated in FIG. 2, each of the unit pixels P includes a processing circuit 41, one or more light detection circuits 11 connected to the processing circuit 41, and a selection circuit 30. The selection circuit 30 is configured to be able to select which processing circuit 41 to input a signal or signals from the light detection circuit(s) 11 to. In the following description, suffixes a, b, c, and d will be omitted where common description applies.

The processing circuit 41 is a circuit for processing a signal or signals of one or more avalanche diodes (ADs) 71 (see FIG. 3) included in a light detection circuit 11. The processing circuit 41 includes a counting unit that counts the signal(s) from the AD(s) 71, and/or a circuit that corrects and compresses the signal(s) of the AD(s) 71. The following description will be given of the case where the processing circuit 41 serves as a counting unit.

FIG. 2 illustrates unit pixels Pa and Pc located in an nth (n is an integer) row and unit pixels Pb and Pd located in an mth (m is an integer other than n) row. The unit pixels Pa and Pb are located in an lth (1 is an integer) column. The unit pixels Pc and Pd are located in a kth (k is an integer other than l) column. In FIG. 2, a control line PVSEL[0] controls a processing circuit 41a included in the unit pixel Pa and a processing circuit 41c included in the unit pixel Pc. A control line PVSEL[1] controls a processing circuit 41b included in the unit pixel Pb and the processing circuit 41d included in the unit pixel Pd.

A light detection circuit 11a included in the unit pixel Pa and a light detection circuit 11b included in the unit pixel Pb are connected via a selection circuit 30a. A light detection circuit 11c included in the unit pixel Pc and a light detection circuit 11d included in the unit pixel Pd are connected via a selection circuit 30b. In the following description, the selection circuit 30, the plurality of light detection circuits 11 sharing the selection circuit 30, and a plurality of processing circuits 41 sharing the selection circuit 30 will be referred to collectively as a pixel unit 40. In FIG. 2, the pixel unit 40 includes two light detection circuits 11 and two processing circuits 41. As will be described in detail below, the selection circuit 30 can control an electrical connection relationship between the light detection circuits 11 and the processing circuits 41 based on control signals PSW supplied from the selection signal supply circuit 4.

FIG. 3 illustrates an equivalent circuit diagram of one pixel unit 40. In FIG. 3, two light detection circuits 11 and two processing circuits 41 share the selection circuit 30.

The light detection circuits 11 output pulses based on photon incidence. Each of the light detection circuits 11 includes one or more ADs 71, a quenching element 72 including one or more resistive elements such as a P-type metal-oxide-silicon (MOS) transistor and a diffused resistor, and a waveform shaping unit 73 including one or more inverter circuits. The counting unit included in each of the processing circuits 41 generates a count signal indicating a count value of pulses output from the light detection circuits 11.

The anode of each AD 71 is connected to a power supply line for supplying a voltage VSS. The cathode of the AD 71 is connected to the drain(s) of the P-type MOS transistor(s) or one end(s) of the diffused resistor(s) constituting the quenching element 72. The drain(s) of the P-type MOS transistor(s) or the other end(s) of the diffused resistor(s) constituting the quenching element 72 is/are connected to a power supply line for supplying a voltage VDD. An input terminal of the waveform shaping unit 73 is connected to a connection node between the AD 71 and the quenching element 72.

The power supply lines for supplying the voltages VDD and VSS apply a reverse bias voltage higher than a breakdown voltage to the AD 71 via the quenching element 72.

The AD 71 is thereby set to operate in a Geiger mode. If a photon is incident on the AD 71, a large number of electrons (and holes) are generated by an avalanche phenomenon based on an electron excited by the incident photon. This lowers a potential of the cathode of the AD 71, and the potential drops below a threshold voltage of the waveform shaping unit 73. A drop in the potential caused by the avalanche phenomenon stops if the reverse bias on a PN junction of the AD 71 reaches a predetermined value. This stops an avalanche current, and a cathode potential of the AD 71 is pulled up to the voltage VDD by the quenching element 72. In the meantime, the cathode potential of the AD 71 serves as the threshold voltage of the waveform shaping unit 73. This brings the operating domain of the AD 71 back to the Geiger mode. In such a manner, the incidence of a photon on the AD 71 changes the cathode potential from above to below the threshold voltage of the waveform shaping unit 73 and from below to above the threshold voltage of the waveform shaping unit 73. As a result, the waveform shaping unit 73 generates an output pulse. With such a configuration, the light detection circuit 11 can output presence or absence of photon incidence as a voltage pulse signal (signal PIXOUT).

An output terminal of the waveform shaping unit 73, which also serves as an output terminal of the light detection circuit 11, is connected to the selection circuit 30. The selection circuit 30 is located between output nodes of the two or more ADs 71 and input nodes of the two or more processing circuits 41. The selection circuit 30 selects a desired AD 71 and a desired processing circuit 41 from among the two or more ADs 71 and the two or more processing circuits 41 connected to the selection circuit 30, and controls connection therebetween. In FIG. 3, the selection circuit 30 includes a switch 31 that selects either to connect or disconnect the light detection circuit 11*a* including an AD 71*a* to or from the processing circuit 41*a*, and a switch 32 that selects either to connect or disconnect the light detection circuit 11*a* to or from the processing circuit 41*b*. The selection circuit 30 further includes a switch 33 that selects either to connect or disconnect the light detection circuit 11*b* including an AD 71*b* to or from the processing circuit 41*b*, and a switch 34 that selects either to connect or disconnect the light detection circuit 11*b* to or from the processing circuit 41*a*. By controlling the switches 31, 32, 33, and 34 to be on and off, the desired processing circuit 41 can be used to count pulses.

The switches 31, 32, 33, and 34 are constituted by N-type MOS transistors, for example. The gates of the N-type MOS transistors constituting the switches 31, 32, 33, and 34 are connected to control lines PSW. The control lines PSW are connected to the selection signal supply circuit 4, and can supply control signals from the selection signal supply circuit 4 to the gates of the N-type MOS transistors. The switches 31, 32, 33, and 34 turn on and become conducting based on the control signals supplied from the control lines PSW. In FIG. 3, the switch 31 is controlled by a control signal PSW_11, the switch 32 by a control signal PSW_12, the switch 33 by a control signal PSW_21, and the switch 34 by a control signal PSW_22.

Next, a driving method for each mode of the photoelectric conversion apparatus 100 according to the present exemplary embodiment will be described with reference to FIGS. 4 to 7. FIGS. 4 to 7 illustrate the control signals PSW supplied from the selection signal supply circuit 4, control signals PVSEL supplied from the vertical selection circuit 3, control signals PHSEL supplied from the horizontal selection circuit 5, and an output signal PDAT. Driving methods based on the respective modes of the photoelectric conversion apparatus 100 will be described below.

<First Imaging Mode>

FIG. 4 is a timing chart illustrating the driving method in the first imaging mode of the photoelectric conversion apparatus 100 according to the present exemplary embodiment.

At time t1, the vertical selection circuit 3 controls not-illustrated control signals from a high level (Hi) to a low level (Lo). This resets the counting units included in the processing circuits 41 of all the unit pixels P. More specifically, the count values indicated by the counting units are reset to 0. Subsequently, in a period before time t2, the vertical selection circuit 3 restores the control signals from Lo to Hi.

At time t2, the selection signal supply circuit 4 controls the control signals PSW_11 and PSW_21 from Lo to Hi to turn on the switches 31 and 33. The light detection circuit 11*a* is thereby connected to the processing circuit 41*a*, and the light detection circuit 11*b* to the processing circuit 41*b*. At the time t2, the control signals PSW_12 and PSW_22 are controlled to be Lo. At time t3, the selection signal supply circuit 4 controls the control signals PSW_11 and PSW_21 from Hi to Lo to turn off the switches 31 and 33. The light detection circuit 11*a* is thereby disconnected from the processing circuit 41*a*, and the light detection circuit 11*b* from the processing circuit 41*b*. In the period from the time t2 to the time t3, the processing circuits 41 counts the numbers of pulses output from the light detection circuits 11.

At time t4, the vertical selection circuit 3 controls a control signal PVSEL[0] from Lo to Hi.

At time t5, the horizontal selection circuit 5 controls a control signal PHSEL[0] from Lo to Hi. The count value output from the processing circuit 41*a* of the unit pixel Pa belonging to the zeroth row and the zeroth column is thereby output to the output circuit 6 via the output line PDAT of the corresponding column.

At time t6, the horizontal selection circuit 5 controls the control signal PHSEL[0] from Hi to Lo, and controls a control signal PHSEL[1] from Lo to Hi. In the photoelectric conversion apparatus 100 illustrated in FIG. 2, the count value output from the processing circuit 41*c* of the unit pixel Pc belonging to the zeroth row and the first column is thereby output to the output circuit 6 via the output line PDAT of the corresponding column.

In a period after the Lo control of the control signal PHSEL[0], i.e., from the time t6 to time t7, the horizontal selection circuit 5 successively controls the control signals PHSEL corresponding to the respective columns to Hi.

At the time t7, the vertical selection circuit 3 controls the control signal PVSEL[0] from Hi to Lo, and controls the control signal PVSEL[1] from Lo to Hi.

At time t8, the horizontal selection circuit 5 controls the control signal PHSEL[0] from Lo to Hi. The count value output from the processing circuit 41*b* of the unit pixel Pb belonging to the first row and the zeroth column is thereby output to the output circuit 6 via the output line PDAT of the corresponding column.

At time t9, the horizontal selection circuit 5 controls the control signal PHSEL[0] from Hi to Lo, and controls the control signal PHSEL[1] from Lo to Hi. The count value output from the processing circuit 41*d* of the unit pixel Pd belonging to the first row and the first column is thereby output to the output circuit 6 via the output line PDAT of the corresponding column.

The horizontal selection circuit 5 controls the control signals PHSEL to successively output the count values from the processing circuits 41 of the unit pixels P belonging to the first row to the output circuit 6. The horizontal selection circuit 5 repeats the operation of the times t4 to t7.

As described above, in the first imaging mode, the plurality of unit pixels P have the same exposure period. In other words, the output of pulses from the light detection circuits 11 included in the respective unit pixels P to the processing circuits 41 is simultaneously enabled between the times t2 and t3. Then, the signals of the ADs 71 included in the respective unit pixels P are processed by the processing circuits 41 included in the same unit pixels P. In other words, the unit pixels P output the signals of the respective unit pixels P.

<Second Imaging Mode>

Next, the driving method in the second imaging mode of the photoelectric conversion apparatus 100 according to the present exemplary embodiment will be described with reference to FIG. 5.

The second imaging mode is similar to the first imaging mode except that the unit pixels Pa and Pb have different exposure periods. Specifically, the switch 31 is turned on at time t2, and then the switch 33 is turned on at time t3. The switch 31 is turned off at time t4, and then the switch 33 is turned off at time t5. More specifically, the light detection circuit 11a is connected to the processing circuit 41a before the light detection circuit 11b is connected to the processing circuit 41b. Then, the light detection circuit 11a is disconnected from the processing circuit 41a before the light detection circuit 11b is disconnected from the processing circuit 41b.

<Distance Measurement Mode>

Next, the driving method in the distance measurement mode of the photoelectric conversion apparatus 100 according to the present exemplary embodiment will be described with reference to FIG. 6. An example of the driving method is a time of flight (ToF) driving method. In the distance measurement mode, the AD 71b included in the light detection circuit 11b is in a non-avalanche state. The control signals PSW_21 and PSW_22 are kept Lo, whereby the light detection circuit 11b is disconnected from the processing circuits 41a and 41b.

At time t1, the vertical selection circuit 3 controls the not-illustrated control signals from Hi to Lo. This resets the counting units included in the processing circuits 41 of all the unit pixels P. More specifically, the count values indicated by the counting units are reset to 0. Subsequently, in a period before time t2, the vertical selection circuit 3 restores the control signals from Lo to Hi.

At the time t2, the selection signal supply circuit 4 controls the control signal PSW_11 from Lo to Hi to turn on the switch 31. The light detection circuit 11a is thereby connected to the processing circuit 41a. At the time t2, a light source L1 emits light toward an object simultaneously with the turn-on of the switch 31.

At time t3, reflected light L2 is detected.

At time t4 when the light emission from the light source L1 ends, the selection signal supply circuit 4 controls the control signal PSW_11 from Hi to Lo to turn off the switch 31. The light detection circuit 11a is thereby disconnected from the processing circuit 41a. Then, the selection signal supply circuit 4 controls the control signal PSW_12 from Lo to Hi to turn on the switch 32. The light detection circuit 11a is thereby connected to the processing circuit 41b.

At time t5, the reflected light L2 stops being detected.

At time t6, the selection signal supply circuit 4 controls the control signal PSW_12 from Hi to Lo to turn off the switch 32. The light detection circuit 11a is thereby disconnected from the processing circuit 41b.

The subsequent operation is similar to that in the first imaging mode. Thus, a description thereof will be omitted.

In the present exemplary embodiment, the count value of the processing circuit 41a in a period from the time t2 to the time t4 is compared with the count value of the processing circuit 41b in a period from the time t4 to the time t6. This enables measurement of a distance to the object by calculating a delay time of the reflected light L2.

<Thinning Readout Mode>

Next, a thinning readout mode of the photoelectric conversion apparatus 100 according to the present exemplary embodiment will be described. The operation in the thinning readout mode is similar to that in the timing chart of FIG. 6 except that no light source L1 is provided and no reflected light L2 is measured. Thus, the following description will be given with reference to FIG. 6.

The thinning readout mode refers to, for example, a mode where the light detection circuits 11 in some of the plurality of unit pixels P in the pixel area 8 do not output a signal. Examples include a case where, in FIG. 3, the signal from the light detection circuit 11a is read and the signal from the light detection circuit 11b is not. The thinning readout mode can reduce power consumption compared to when all the light detection circuits 11 in the pixel area 8 are put into operation.

In the thinning readout mode, if the count value of the counting unit included in the processing circuit 41a is saturated, the signal can no longer be read. In the present exemplary embodiment, if the count value of the counting unit included in the processing circuit 41a is saturated, subsequent pulse signals can be counted by the counting unit included in the processing circuit 41b. For example, in FIG. 6, in a case where the count value is saturated at the time t4, the signals after the time t4 can be counted by the counting unit included in the processing circuit 41b. By adding the control values of the counting units included in the processing circuits 41a and 41b, the dynamic range can be extended compared to when only the processing circuit 41a is used for counting.

<Global Shutter Operation Mode>

Next, the driving method in the global shutter operation mode of the photoelectric conversion apparatus 100 according to the present exemplary embodiment will be described with reference to FIG. 7. In FIG. 7, the photoelectric conversion apparatus 100 performs a global shutter operation along with thinning-out. Referring to FIG. 7, a description will be given of a case where there are at least two rows and two columns of unit pixels P as illustrated in FIG. 2. In the global shutter operation mode, the ADs 71 included in the light detection circuits 11b and 11d are in the non-avalanche state. The control signals PSW_21 and PSW_22 are kept Lo, whereby the light detection circuit 11b is disconnected from the processing circuits 41a and 41b, and the light detection circuit 11d is disconnected from the processing circuits 41c and 41d.

In a period before time t1, the processing circuit 41b retains the count value of the signals detected by the light detection circuit 11a.

At the time t1, the vertical selection circuit 3 controls a not-illustrated control signal from Hi to Lo. This resets the counting unit included in the processing circuit 41a. More specifically, the count value indicated by the counting unit is reset to 0. Subsequently, in a period before time t2, the vertical selection circuit 3 restores the control signal from Lo to Hi.

At the time t2, the selection signal supply circuit 4 controls the control signal PSW_11 from Lo to Hi to turn on the switch 31. The signal of the light detection circuit 11a is thereby input to the processing circuit 41a. Here, in FIG. 2, signals of a plurality of light detection circuits 11a included in the unit pixel P are input to the processing circuit 41b.

At time t3, the vertical selection circuit 3 controls the control signal PVSEL[1] from Lo to Hi.

At time t4, the horizontal selection circuit 5 controls the control signal PHSEL[0] from Lo to Hi. The count value of the counting unit included in the processing circuit 41b, which is not connected to the light detection circuit 11a, is thereby output to the output circuit 6.

At time t5, the horizontal selection circuit 5 controls the control signal PHSEL[1] from Lo to Hi. The count value of the counting unit included in the processing circuit 41d, which is not connected to the light detection circuit 11c, is thereby output to the output circuit 6.

At time t6, the selection signal supply circuit 4 controls the control signal PSW_11 from Hi to Lo to turn off the switch 31. This ends the signal input to the processing circuit 41a.

At time t7, the selection signal supply circuit 4 controls the control signal PSW_12 from Lo to Hi to turn on the switch 32. The signal from the light detection circuit 11a is thereby input to the processing circuit 41b.

At time t8, the vertical selection circuit 3 controls the control signal PVSEL[0] from Lo to Hi.

At time t9, the horizontal selection circuit 5 controls the control signal PHSEL[0] from Lo to Hi. The count value of the counting unit included in the processing circuit 41a, which is not connected to the light detection circuit 11a, is thereby output to the output circuit 6.

At time t10, the horizontal selection circuit 5 controls the control signal PHSEL[1] from Lo to Hi. The count value of the counting unit included in the processing circuit 41c, which is not connected to the light detection circuit 11c, is thereby output to the output circuit 6.

At time t11, the selection signal supply circuit 4 controls the control signal PSW_12 from Hi to Lo to turn off the switch 32. This ends the signal input to the processing circuit 41b.

Accordingly, by the driving method in the global shutter operation mode, the count value of the processing circuit 41b can be output while the processing circuit 41a is counting signals. By the driving method in the global shutter operation mode, the signals of the light detection circuit 11 in one row and the signals of the light detection circuits 11 in another row can be simultaneously input to the corresponding processing circuit 41. Since an exposure period where one processing circuit 41 counts signals and a read period where signals are read from another processing circuit 41 can coexist, the time to generate a single image can be reduced compared to when the signals are successively read. In the foregoing description, the unit pixels P are described to be arranged in two rows and two columns. However, the unit pixels P may be arranged in two or more rows and two or more columns. In the global shutter operation mode, the light detection circuits 11 do not necessarily need to be decimated. For example, a signal obtained by adding the outputs of the light detection circuits 11a and 11b through a logic gate may be input to the processing circuit 41a or 41b.

As described above, the photoelectric conversion apparatus 100 according to the present exemplary embodiment can freely change the connection relationship between the light detection circuits 11 and the processing circuits 41 by selection circuits 30 based on the operation mode. This can give the photoelectric conversion apparatus 100 high versatility. In some operation modes, the processing circuits 41 that would not be used without the selection circuits 30 can be used to improve performance while preventing a drop in area efficiency.

In FIG. 3, the selection circuit 30 is described to be controlled by the switches 31, 32, 33, and 34. However, the selection circuit 30 may be controlled by a configuration other than switches as long as the processing circuits 41a and 41b can be selected. For example, the selection circuit 30 may include a logic gate such as an AND gate or an OR gate, and the processing circuit 41 to input signals to may be selected by controlling a control signal input to the logic gate.

In FIGS. 2 and 3, each of the light detection circuits 11 includes one AD 71. However, each of the light detection circuits 11 may include two or more ADs 71. In such a case, one quenching element 72 and one waveform shaping unit 73 are provided in each AD 71. Such a light detection circuit 11 includes an OR circuit, and the output terminals of two or more waveform shaping units 73 corresponding to the two or more ADs 71 are connected to the OR circuit. An output terminal of the OR circuit serves as the output terminal of the light detection circuit 11 and is connected to the selection circuit 30.

Only some of the plurality of unit pixels P included in the photoelectric conversion apparatus 100 may include the selection circuit 30. Provision of the selection circuit 30 even for only some of the unit pixels P can provide a certain level of versatility. For example, in the case of operating the photoelectric conversion apparatus 100 in the distance measurement mode, certain pixel units 40 used for distance measurement may be fixed. The other unit pixels P not used for the distance measurement may not include the selection circuit 30.

The modes may be run in parallel. For example, pixel units 40 in one row may be operated in the distance measurement mode while pixel units 40 in another row are operated in the first imaging mode. This enables execution of imaging and distance measurement in parallel.

In the distance measurement mode and the thinning readout mode illustrated in FIG. 6 and the global shutter operation mode illustrated in FIG. 7, the switch 33 is kept off. With the switch 33 off, the quenching element 72b may output pulses since the signals from the light detection circuit 11b are prevented from being input to the processing circuit 41b. In view of power consumption by avalanche multiplication, the AD 71b is desirably controlled to a voltage not causing the avalanche multiplication in a period where the switch 33 is off. In other words, the AD 71b is desirably in a non-avalanche state. Alternatively, the AD 71b may cause the avalanche multiplication while the quenching element 72b is put in a non-operating state. If the switch 33 is on, either of the following conditions may be satisfied: the AD 71b is controlled to a voltage not causing avalanche multiplication, and the quenching element 72b is in a non-operating state.

In the distance measurement mode, the thinning readout mode, and the global shutter operation mode, the configuration in which the signals from the light detection circuit 11a are read and the signals from the light detection circuit 11b are not read has been described. However, the configuration may be reversed. More specifically, the configuration may be such that the signals from the light detection circuit 11b are read and the signals from the light detection circuit 11a are not read. In such a case, on-off timing of the switch 31 corresponds to that of the switch 33, and on-off timing of the switch 32 corresponds to that of the switch 34.

A photoelectric conversion apparatus according to a second exemplary embodiment of the disclosure will be described with reference to FIG. 8. Components similar to those of the photoelectric conversion apparatus 100 according to the first exemplary embodiment are denoted by the same reference numerals, and a description thereof will be omitted or simplified.

The second exemplary embodiment differs from the first exemplary embodiment in that a pixel unit 40 includes three light detection circuits 11 and three processing circuits 41. Other elements are similar to those of the photoelectric conversion apparatus 100 according to the first exemplary embodiment except those described below.

Figure 8:
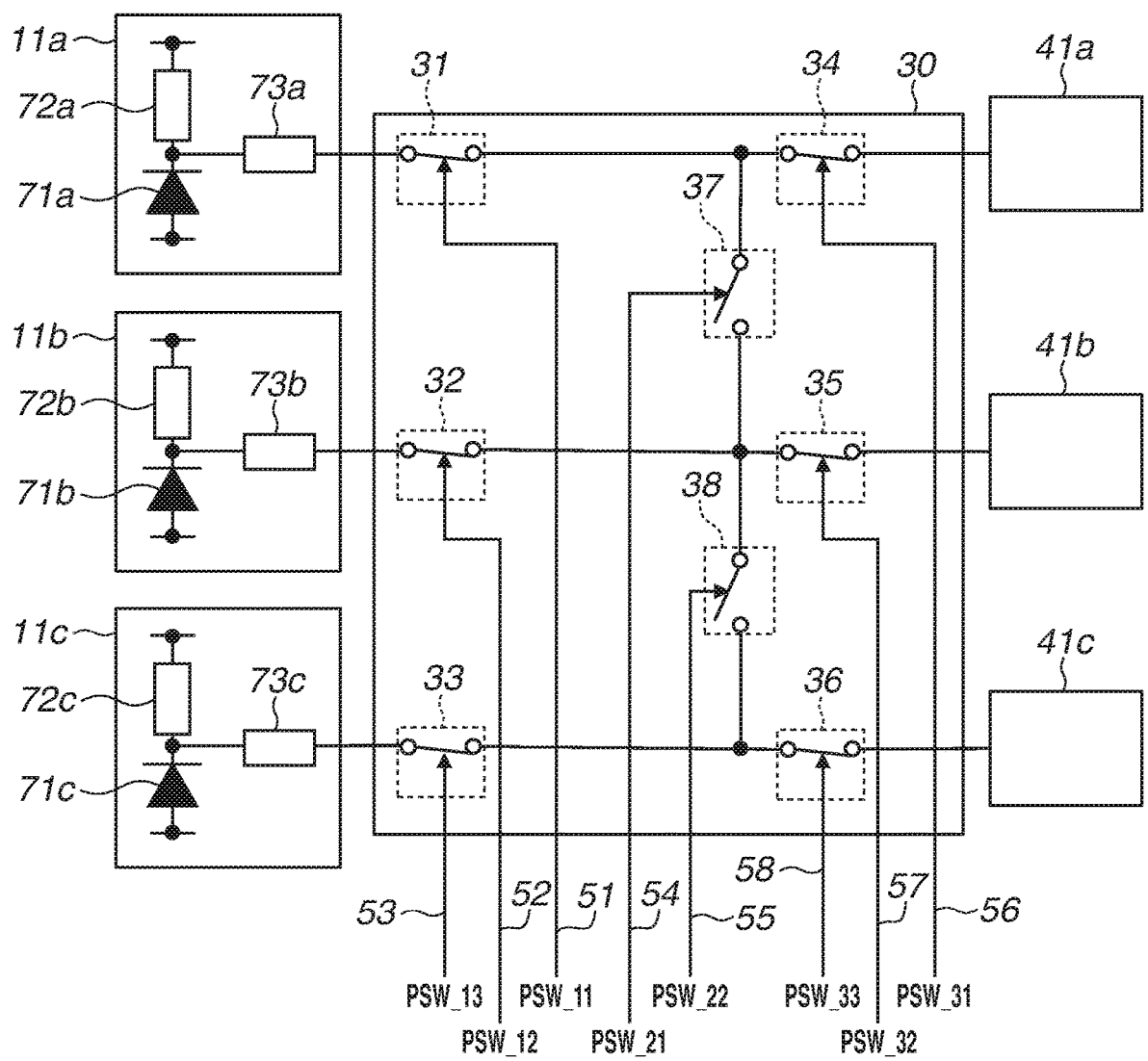
FIG. 8 is an equivalent circuit diagram illustrating a configuration example of pixels in a photoelectric conversion apparatus according to a second exemplary embodiment.

As illustrated in FIG. 8, each unit pixel P of the photoelectric conversion apparatus according to the present exemplary embodiment includes, like the first exemplary embodiment, the light detection circuit 11 and the processing circuit 41. The light detection circuit 11 and the processing circuit 41 are similar to those of the photoelectric conversion apparatus 100 according to the first exemplary embodiment illustrated in FIG. 3. The selection circuit 30, which can select the connection relationship between the light detection circuits 11 and the processing circuits 41 included in the pixel unit 40, includes switches different from those in the first exemplary embodiment.

Switches 31 to 38 are N-type MOS transistors, for example. The switches 31 to 38 can be controlled by the control signals PSW from the selection signal supply circuit 4.

The switch 31 controls whether to transmit the signal output from the light detection circuit 11a to the processing circuit 41 included in the pixel unit 40. The switch 32 controls whether to transmit the signal output from the light detection circuit 11b to the processing circuit 41 included in the pixel unit 40. The switch 33 controls whether to transmit the signal output from the light detection circuit 11c to the processing circuit 41 included in the pixel unit 40. The switch 34 controls input of the signal to the processing circuit 41a. The switch 35 controls input of the signal to the processing circuit 41b. The switch 36 controls input of the signal to the processing circuit 41c. The switches 37 and 38 control input of a signal from the light detection circuit 11 included in the pixel unit 40 so that the signal is input to the processing circuit 41 of the unit pixel P different from the unit pixel P corresponding to the light detection circuit 11.

Figure 9:
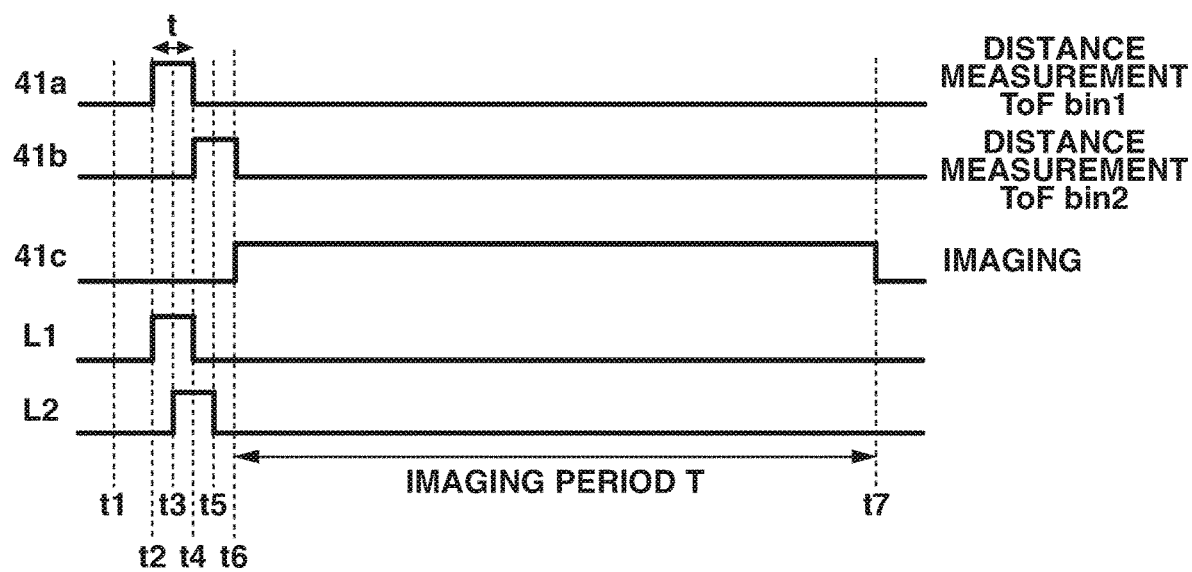
FIG. 9 is a timing chart of the photoelectric conversion apparatus according to the second exemplary embodiment.

FIG. 9 is a timing chart illustrating a driving method in a case where a single pixel unit 40 performs both distance measurement and imaging in the photoelectric conversion apparatus according to the present exemplary embodiment.

In FIG. 9, the operation of time t1 to time t6 is similar to that in FIG. 6 according to the first exemplary embodiment. Thus, a description thereof will be omitted. In the present exemplary embodiment, at the time t6, the counting unit included in the processing circuit 41c is started. More specifically, the selection signal supply circuit 4 controls control signals PSW_13 and PSW_33 to turn on the switches 33 and 36. At the time t1, the vertical selection circuit 3 controls not-illustrated control signals from Hi to Lo.

At time t7, the selection signal supply circuit 4 turns off at least the switch 36. Imaging is performed from the time t6 to the time t7.

A period from the time t2 when the light source L1 starts emitting of light to the time t4 when the light source L1 ends the emitting of light will be referred to as a pulse period t.

A period from the time t6 when imaging starts to the time t7 when the imaging ends will be referred to as an imaging period T. In such a case, an external light component can be obtained by multiplying an imaging result in the imaging period T by t/T. Then, the external light component can be excluded from an imaging signal and a distance measurement signal.

In FIG. 9, a distance measurement period (from time t2 to time t6) and the imaging period T are different. However, this is not restrictive. The distance measurement period and the imaging period T may overlap at least in part as long as the light emitted from the light source L1 and the reflected light L2 can be prevented from being incident on the light detection circuit 11 that generates the imaging signal.

The present exemplary embodiment provides the effect that the single pixel unit 40 can perform the distance measurement and imaging while reducing the external light component, in addition to the functions described in the first exemplary embodiment.

A photoelectric conversion apparatus according to a third exemplary embodiment will be described with reference to FIG. 10. The present exemplary embodiment differs from the second exemplary embodiment in that a pixel unit 40 includes four light detection circuits 11 and four processing circuits 41. Components similar to those of the photoelectric conversion apparatuses according to the first and second exemplary embodiments are denoted by the same reference numerals, and a description thereof will be omitted or simplified.

Figure 10:
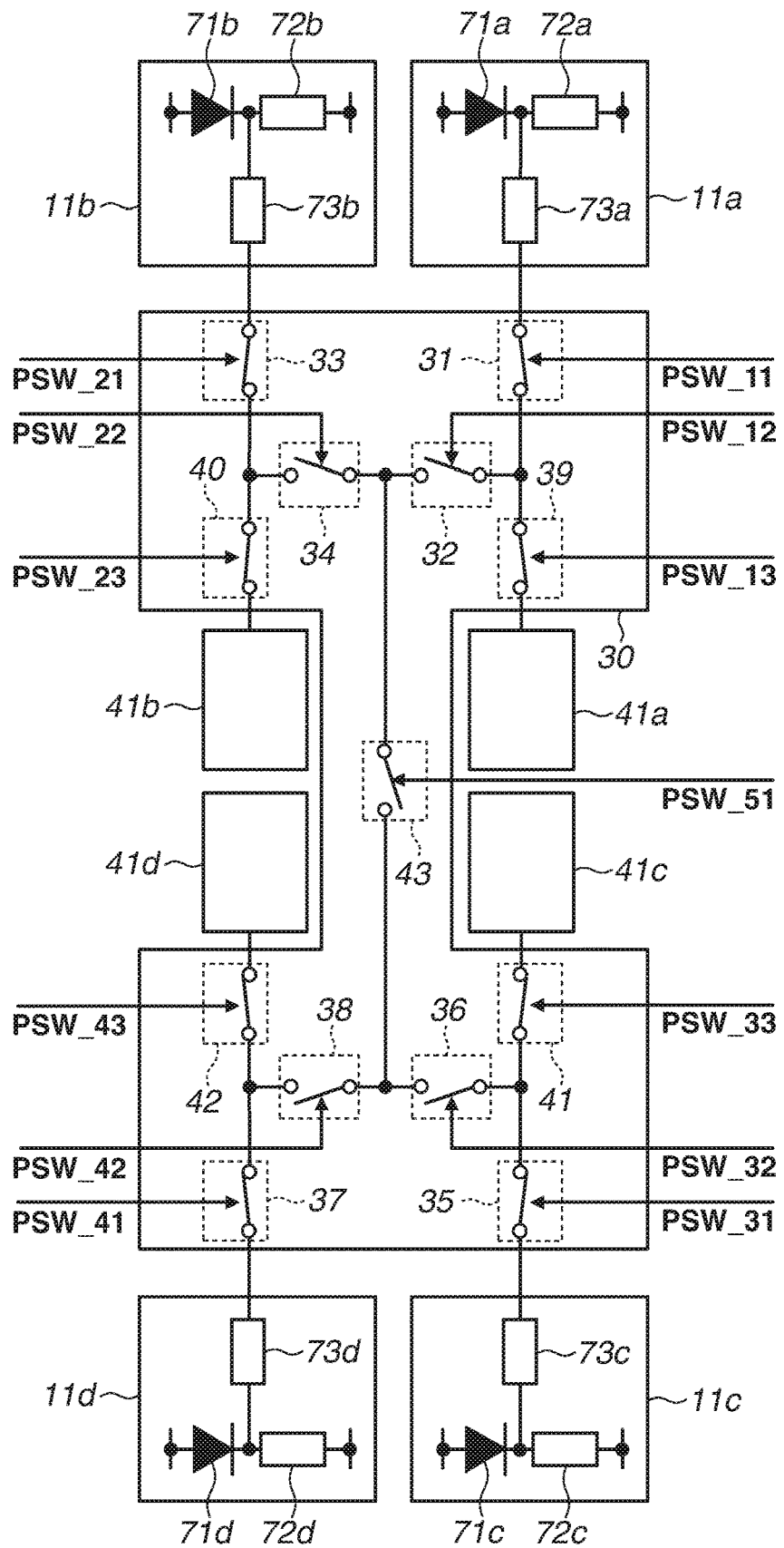
FIG. 10 is an equivalent circuit diagram illustrating a configuration example of pixels in a photoelectric conversion apparatus according to a third exemplary embodiment.

FIG. 10 illustrates the pixel unit 40 including the four light detection circuits 11 and the four processing circuits 41. The selection circuit 30 can freely select the connection relationship between the light detection circuits 11 and the processing circuits 41 included in the pixel unit 40. More specifically, the selection circuit 30 includes switches 31 to 43 and can freely set the connection relationship between the light detection circuits 11 and the processing circuits 41 by controlling the switches 31 to 43 on and off.

In FIG. 10, the pixel unit 40 includes unit pixels P arranged in two rows and two columns. Specifically, light detection circuits 11a and 11c are arranged in one row, and light detection circuits 11b and 11d in another row.

According to the present exemplary embodiment, similar effects to those of the second exemplary embodiment can be obtained. In the thinning readout mode, a significant effect of power consumption reduction can be obtained compared to the first exemplary embodiment.

A photoelectric conversion apparatus according to a fourth exemplary embodiment will be described with reference to FIG. 11. The fourth exemplary embodiment differs from the third exemplary embodiment in that the unit pixels P include color filters. Components similar to those of the photoelectric conversion apparatuses according to the first to third exemplary embodiments are denoted by the same reference numerals, and a description thereof will be omitted or simplified.

Figure 11:
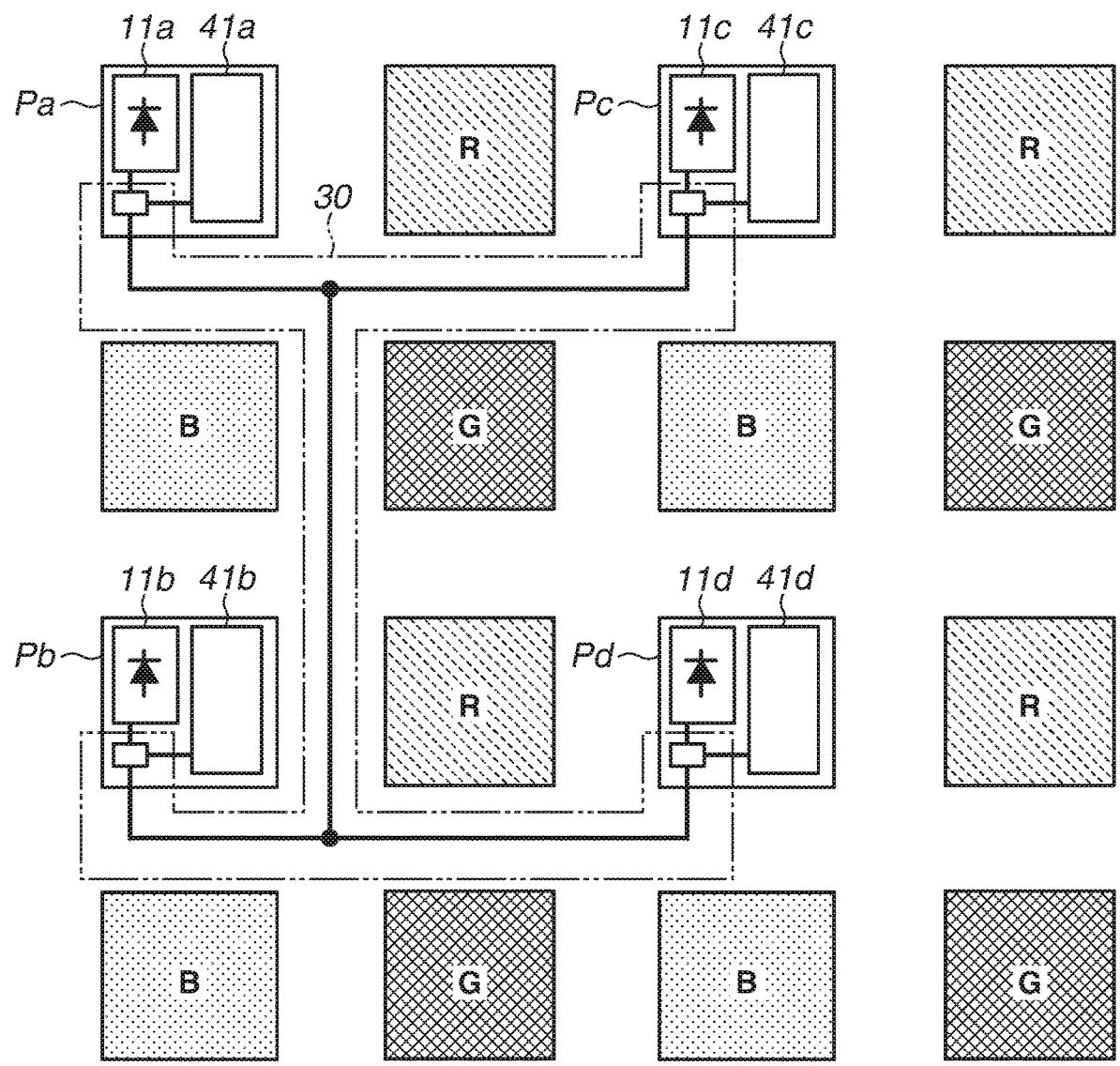
FIG. 11 is a diagram for schematically describing a configuration of a photoelectric conversion apparatus according to a fourth exemplary embodiment.

FIG. 11 is a diagram illustrating a relationship between a layout of the unit pixels P and a layout of the color filters.

In FIG. 11, a color filter transmitting green light will be denoted by G, a color filter transmitting red light will be denoted by R, and a color filter transmitting blue light will be denoted by B. All the four unit pixels Pa, Pb, Pc, and Pd connected by the selection circuit 30 are unit pixels P that photoelectrically convert green light. In other words, color filters on the four unit pixels Pa, Pb, Pc, and Pd are color filters G transmitting green light. In the present exemplary embodiment, one green pixel in a two-row two-column unit pixel set including red, green, green, and blue unit pixels P is connected to three green pixels included in respective three unit pixel sets among adjoining unit pixel sets.

According to the photoelectric conversion apparatus of the present exemplary embodiment, unit pixels P that photoelectrically convert light of the same color can be connected to prevent color mixing.

A photoelectric conversion apparatus according to a fifth exemplary embodiment will be described with reference to FIG. 12. The fifth exemplary embodiment differs from the first exemplary embodiment in that the photoelectric conversion apparatus is a stacked photoelectric conversion apparatus. Components similar to those of the photoelectric conversion apparatuses according to the first to fourth exemplary embodiments are denoted by the same reference numerals, and a description thereof will be omitted or simplified.

Figure 12:
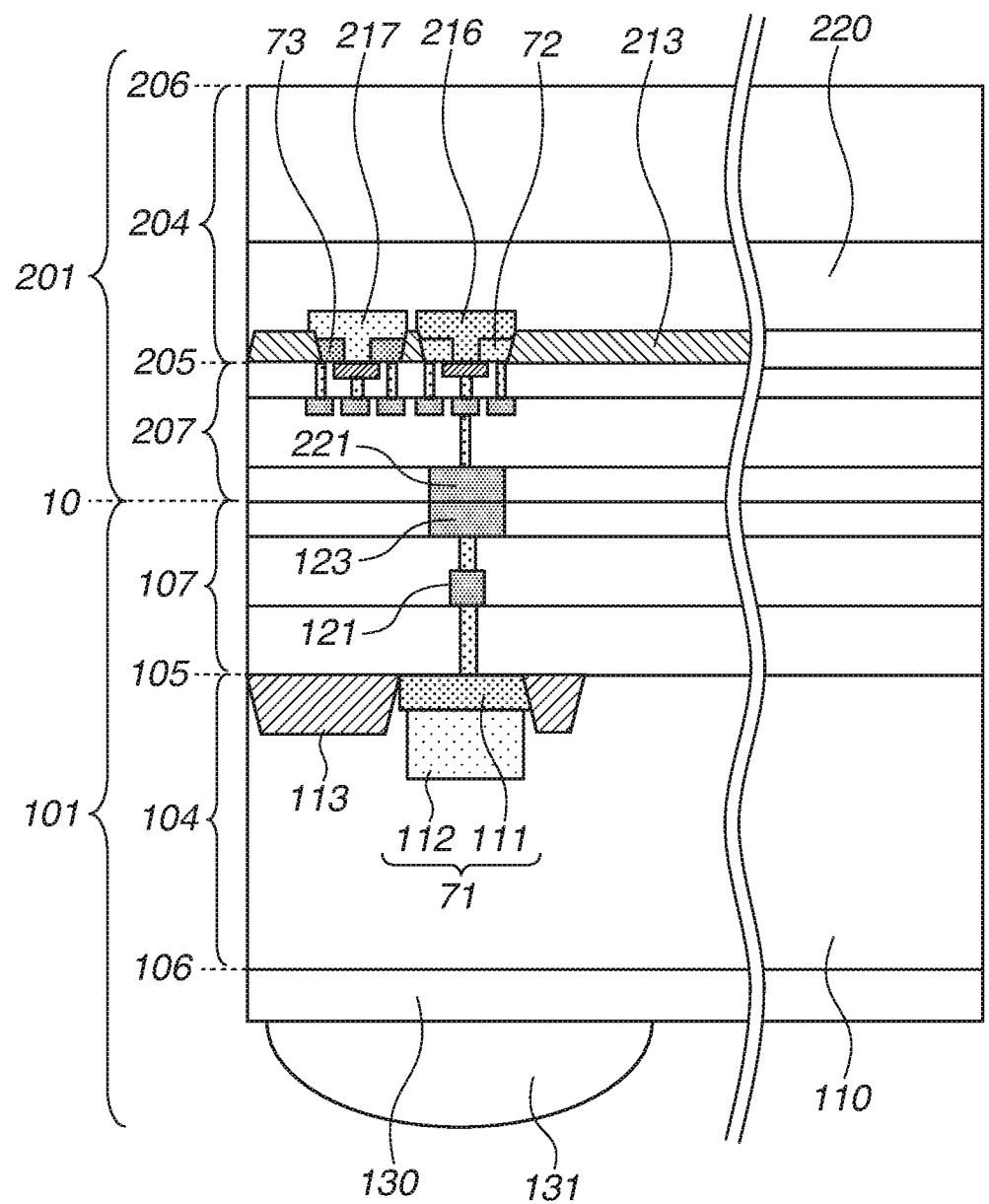
FIG. 12 is a sectional view for schematically describing a configuration of a photoelectric conversion apparatus according to a fifth exemplary embodiment.

FIG. 12 is a sectional view schematically illustrating a structure of the photoelectric conversion apparatus according to the present exemplary embodiment. FIG. 12 illustrates a sectional structure of a unit pixel P. The photoelectric conversion apparatus includes a first chip 101 and a second chip 201. The first and second chips 101 and 201 are bonded together at a bonding surface 10. The first chip 101 includes the AD 71 among the components of the unit pixel P. The second chip 201 includes the components of the unit pixel P other than the AD 71, i.e., the quenching element 72 and the waveform shaping unit 73.

The first chip 101 includes a first semiconductor substrate 104. The first semiconductor substrate 104 has a main surface 105 that is the side closer to the bonding surface 10, and a back surface 106 that is the opposite side. The first semiconductor substrate 104 includes wells 110 and an element isolation region 113 isolating the wells 110 from each other. The AD 71 is located in each well 110 on a main surface 105 side. The AD 71 includes a PN junction of an N-type region 111 in contact with the main surface 105 and a P-type region 112 in contact with the bottom of the N-type region 111. A multilayer wiring structure 107 including a wiring layer 121 and a wiring layer 123 is located on the main surface 105 of the first semiconductor substrate 104. The AD 71 and the wiring layer 121, and the wiring layers 121 and 123, are electrically connected, for example, by contact plugs made of tungsten. A color filter layer 130 including a planarization layer and a microlens 131 are located on the back surface 106 of the first semiconductor substrate 104.

The second chip 201 includes a second semiconductor substrate 204. The second semiconductor substrate 204 has a main surface that is on a side closer to the bonding surface 10, and a back surface that is on an opposite side. An N-type well 216, a P-type well 217, and an element isolation region 213 isolating the N-type and P-type wells 216 and 217 from each other are located on the main surface of the second semiconductor substrate 204. The N-type and P-type wells 216 and 217 are located in a well 220. The N-type well 216 includes a P-type MOS transistor that includes source and domain regions and a gate electrode and that constitutes the quenching element 72. A multilayer wiring structure 207 including a wiring layer 221 is located on the main surface of the second semiconductor substrate 204. Terminals of the quenching element 72 are electrically connected to the wiring layer 221, for example, by contact plugs made of tungsten.

The first and second chips 101 and 201 are bonded together so that the uppermost wiring layer 123 of the first chip 101 and the lowermost wiring layer 221 of the second chip 201 are electrically connected at the bonding surface 10.

Thus, the photoelectric conversion apparatus according to the present exemplary embodiment can be configured as a back-illuminated photoelectric conversion apparatus where light incident on the back surface 106 of the first semiconductor substrate 104 is guided to the AD 71 through the microlens 131 and the color filter layer 130. However, the photoelectric conversion apparatus according to the present exemplary embodiment does not necessarily need to be the back-illuminated photoelectric conversion apparatus and may be a front-illuminated photoelectric conversion apparatus.

Figure 13:
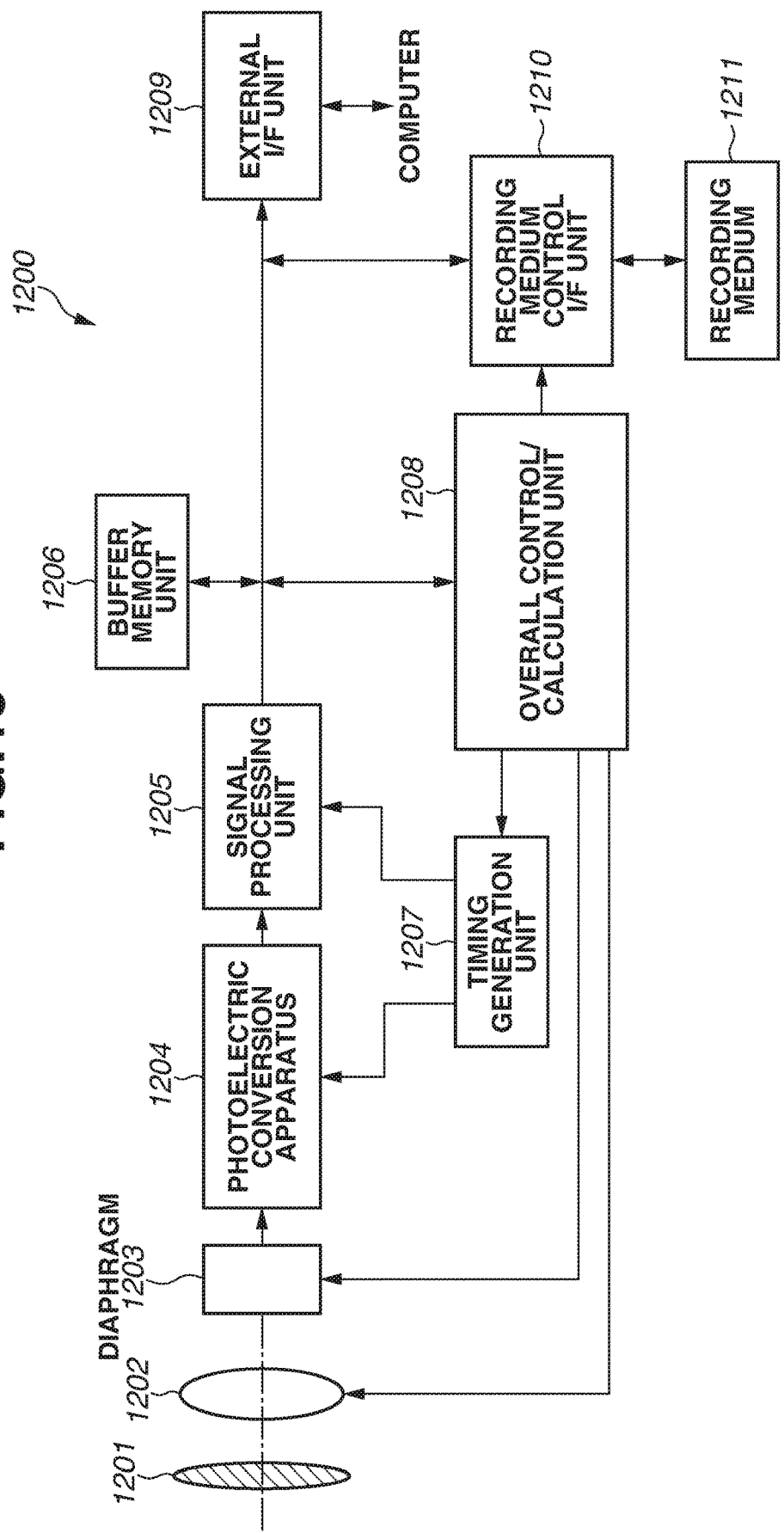
FIG. 13 is a block diagram schematically illustrating a configuration of a photoelectric conversion system according to a sixth exemplary embodiment.

FIG. 13 is a block diagram illustrating a configuration of a photoelectric conversion system 1200 according to a sixth exemplary embodiment. The photoelectric conversion system 1200 according to the present exemplary embodiment includes a photoelectric conversion apparatus 1204. Any one of the photoelectric conversion apparatuses described in the foregoing exemplary embodiments may be applied to the photoelectric conversion apparatus 1204. The photoelectric conversion system 1200 can be used as an imaging system, for example. Specific examples of the imaging system include a digital still camera, a digital camcorder, and a surveillance camera. FIG. 13 illustrates the digital still camera as an example of the photoelectric conversion system 1200.

The photoelectric conversion system 1200 illustrated in FIG. 13 includes the photoelectric conversion apparatus 1204, a lens 1202, a diaphragm 1203, and a barrier 1201. The lens 1202 forms an optical image of an object on the photoelectric conversion apparatus 1204. The diaphragm 1203 is intended to change an amount of light passed through the lens 1202. The barrier 1201 is intended to protect the lens 1202. The lens 1202 and the diaphragm 1203 constitute an optical system for collecting light on the photoelectric conversion apparatus 1204.

The photoelectric conversion system 1200 includes a signal processing unit 1205 that processes an output signal output from the photoelectric conversion apparatus 1204. The signal processing unit 1205 performs a signal processing operation for making various corrections to and compressing the input signal as appropriate, and outputting the resulting signal. The photoelectric conversion system 1200 further include a buffer memory unit 1206 for temporarily storing image data, and an external interface (I/F) unit 1209 for communicating with an external computer. The photoelectric conversion system 1200 further includes a recording medium 1211 such as a semiconductor memory to record and read imaging data to/from, and a recording medium control I/F unit 1210 for recording and reading the imaging data to/from the recording medium 1211. The recording medium 1211 may be built in or detachably attachable to the photoelectric conversion system 1200. The communication between the recording medium control I/F unit 1210 and the recording medium 1211 and the communication from the external I/F unit 1209 may be performed wirelessly.

The photoelectric conversion system 1200 further includes an overall control/calculation unit 1208 and a timing generation unit 1207. The overall control/calculation unit 1208 performs various calculations and controls the entire digital still camera. The timing generation unit 1207 outputs various timing signals to the photoelectric conversion apparatus 1204 and the signal processing unit 1205. The timing signals may be input from outside. The photoelectric conversion system 1200 may include at least the photoelectric conversion apparatus 1204 and the signal processing unit 1205 that processes the output signal output from the photoelectric conversion apparatus 1204. The timing generation unit 1207 may be included in the photoelectric conversion apparatus 1204. The overall control/calculation unit 1208 and the timing generation unit 1207 may be configured to implement part or all of control functions of the photoelectric conversion apparatus 1204.

The photoelectric conversion apparatus 1204 outputs an image signal to the signal processing unit 1205. The signal processing unit 1205 applies predetermined signal processing to the image signal output from the photoelectric conversion apparatus 1204, and outputs image data. The signal processing unit 1205 also generates an image from the image signal. The signal processing unit 1205 may further perform distance measurement calculation on a signal output from the photoelectric conversion apparatus 1204. The signal processing unit 1205 and the timing generation unit 1207 may be included in the photoelectric conversion apparatus 1204. More specifically, the signal processing unit 1205 and the timing generation unit 1207 may be located on the substrate including the unit pixels P or on another substrate as described in the fifth exemplary embodiment. An imaging system that can obtain an image of higher quality can be implemented by constituting the imaging system using the photoelectric conversion apparatus according to one of the foregoing exemplary embodiments.

Figure 14A:
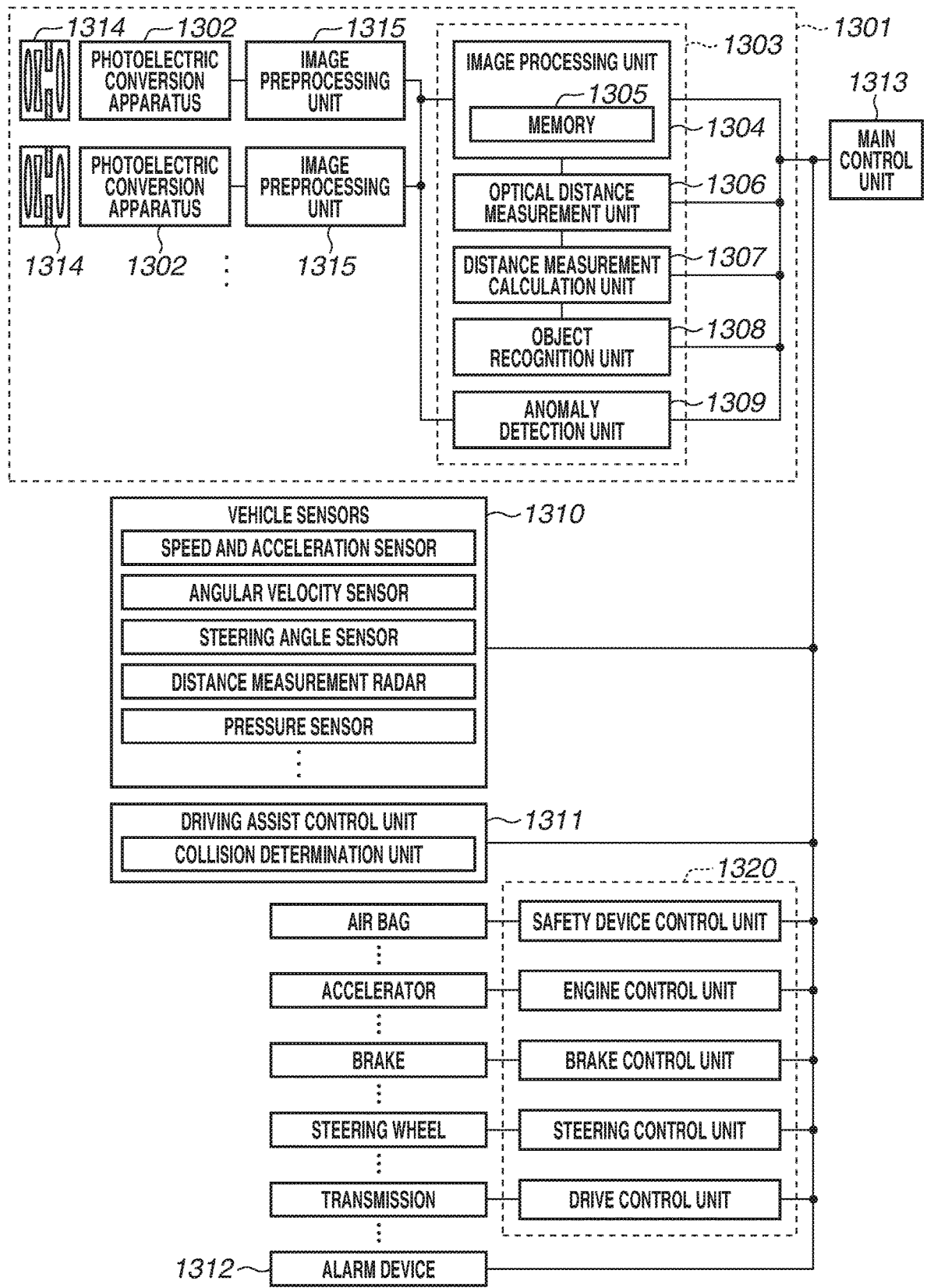
Figure 15:
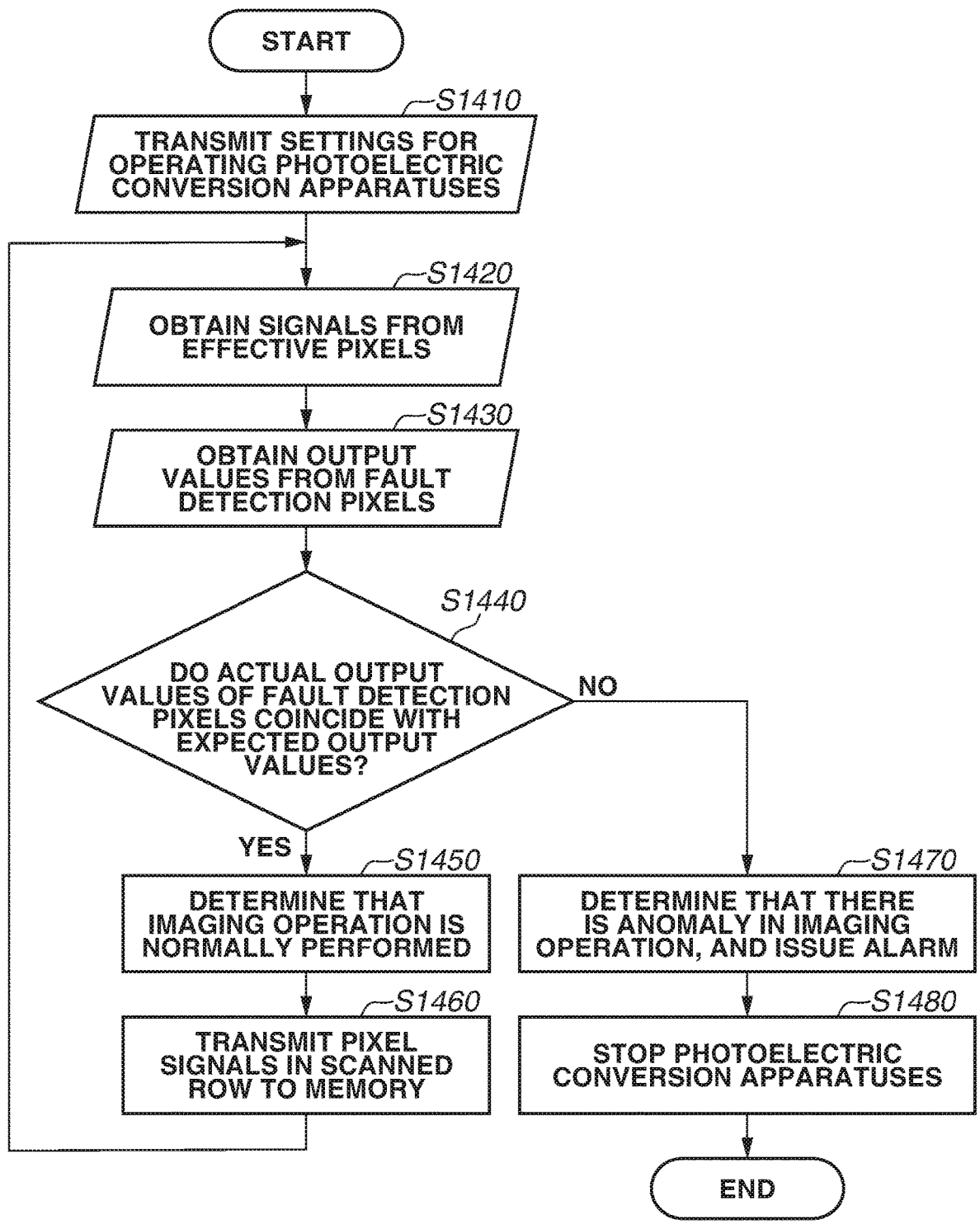
FIG. 15 is a flowchart illustrating an operation of the photoelectric conversion system according to the seventh exemplary embodiment.

A photoelectric conversion system and a moving body according to a seventh exemplary embodiment will be described with reference to FIGS. 14A, 14B, and 15. FIGS. 14A and 14B are schematic diagrams illustrating a configuration example of the photoelectric conversion system and the moving body according to the present exemplary embodiment. FIG. 15 is a flowchart illustrating an operation of the photoelectric conversion system according to the present exemplary embodiment. In the present exemplary embodiment, an in-vehicle camera will be described as an example of the photoelectric conversion system.

FIGS. 14A and 14B illustrate an example of a vehicle system and a photoelectric conversion system mounted thereon that performs imaging. A photoelectric conversion system 1301 includes photoelectric conversion apparatuses 1302, image preprocessing units 1315, an integrated circuit 1303, and optical systems 1314. The optical systems 1314 each forms an optical image of an object on the respective photoelectric conversion apparatuses 1302. The photoelectric conversion apparatuses 1302 each converts the optical image of the object formed by the respective optical systems 1314 into electrical signals. Each of the photoelectric conversion apparatuses 1302 may be any one of the photoelectric conversion apparatuses according to the foregoing exemplary embodiments. The image preprocessing units 1315 perform predetermined signal processing on signals output from the photoelectric conversion apparatuses 1302. Functions of the image preprocessing units 1315 may be built in the photoelectric conversion apparatuses 1302. The photoelectric conversion system 1301 includes at least two sets, each set including the optical system 1314, the photoelectric conversion apparatus 1302, and the image preprocessing unit 1315. The output from the image preprocessing unit 1315 in each set is input to the integrated circuit 1303.

The integrated circuit 1303 is an integrated circuit for imaging system applications. The integrated circuit 1303 includes an image processing unit 1304 including a memory 1305, an optical distance measurement unit 1306, a distance measurement calculation unit 1307, an object recognition unit 1308, and an anomaly detection unit 1309. The image processing unit 1304 performs image processing such as development processing and defect correction on the output signals of the image preprocessing units 1315. The memory 1305 temporarily stores a captured image and stores a defect position of an imaging pixel. The optical distance measurement unit 1306 performs focusing and distance measurement on the object. The distance measurement calculation unit 1307 calculates distance measurement information from a plurality of pieces of image data obtained by the plurality of photoelectric conversion apparatuses 1302. The object recognition unit 1308 recognizes objects such as a car, road, sign, and person. The anomaly detection unit 1309 detects an anomaly in the photoelectric conversion apparatuses 1302, and warns a main control unit 1313 of the anomaly if any.

The integrated circuit 1303 may be implemented by hardware designed for dedicated use, by software modules, or by a combination of these. A field programmable gate array (FPGA) or an application specific integrated circuit (ASIC) may be used for implementation. A combination of these may be used for implementation.

The main control unit 1313 controls overall operation of the photoelectric conversion system 1301, vehicle sensors 1310, and control units 1320. However, a scheme may be employed where the main control unit 1313 is not provided and the photoelectric conversion system 1301, the vehicle sensors 1310, and the control units 1320 each include an individual communication interface to transmit and receive control signals to/from each other via a communication network (for example, Controller Area Network (CAN) standard).

The integrated circuit 1303 has a function of receiving control signals from the main control unit 1313 or generating control signals by its own control unit, and transmitting the control signals and setting values to the photoelectric conversion apparatuses 1302.

The photoelectric conversion system 1301 is connected to the vehicle sensors 1310 and can detect driving conditions of a vehicle, such as a vehicle speed, a yaw rate, and a steering angle, as well as an environment outside the vehicle and the states of other vehicles and obstacles. The vehicle sensors 1310 also serve as a distance information acquisition unit for obtaining distance information about a distance to an object. The photoelectric conversion system 1301 is also connected to a driving assist control unit 1311 that provides various types of driving assist functions such as an automatic steering function, an automatic cruising function, and a collision avoidance function. In particular, a collision determination function includes prediction and determination of presence or absence of a collision with another vehicle or an obstacle based on detection results of the photoelectric conversion system 1301 and the vehicle sensors 1310. If a collision is predicted, the main control unit 1313 performs an avoidance control. In case of a collision, the main control unit 1313 activates a safety device.

The photoelectric conversion system 1301 is also connected to an alarm device 1312 that issues an alarm to a driver based on a determination result made by a collision determination unit. For example, if the determination result made by the collision determination unit indicates a high possibility of collision, the main control unit 1313 performs a vehicle control for avoiding the collision and reducing damage by applying the brake, releasing the accelerator, controlling engine power output, etc. The alarm device 1312 warns the driver by issuing an alarm sound, displaying alarm information on a display unit screen of a car navigation system or an instrument panel, and/or vibrating a seatbelt or steering wheel.

In the present exemplary embodiment, the photoelectric conversion system 1301 captures images of surroundings of the vehicle, for example, in front of or behind the vehicle. FIG. 14B illustrates a layout example of the photoelectric conversion system 1301 in the case where the photoelectric conversion system 1301 captures images in front of the vehicle.

The two photoelectric conversion apparatuses 1302 are located in a front part of a vehicle 1300. Specifically, with a center line in a front-to-back direction or in terms of an external shape (for example, vehicle width) of the vehicle 1300 as an axis of symmetry, the two photoelectric conversion apparatuses 1302 may be symmetrically arranged about the axis of symmetry. Such a layout is desirable in obtaining the distance information about the distance between the vehicle 1300 and the object and in determining a possibility of collision. The photoelectric conversion apparatuses 1302 can be located to not interfere with a field of view of the driver when the driver visually observes conditions outside the vehicle 1300 from the driver's seat. The alarm device 1312 is desirably located at a position to easily come into the field of view of the driver.

Next, a fault detection operation of the photoelectric conversion apparatuses 1302 in the photoelectric conversion system 1301 will be described with reference to FIG. 15. The fault detection operation of the photoelectric conversion apparatuses 1302 is performed based on steps S1410 to S1480 illustrated in FIG. 15.

In step S1410, settings for starting up the photoelectric conversion apparatuses 1302 are made. More specifically, the settings for operating the photoelectric conversion apparatuses 1302 are transmitted from outside the photoelectric conversion system 1301 (for example, the main control unit 1313) or inside the photoelectric conversion system 1301 so that the photoelectric conversion apparatuses 1302 start an imaging operation and a fault detection operation.

In step S1420, the photoelectric conversion system 1301 obtains pixel signals from effective pixels. In step S1430, the photoelectric conversion system 1301 obtains output values from fault detection pixels provided for fault detection. Like the effective pixels, the fault detection pixels include photoelectric conversion units. A predetermined voltage is written to the photoelectric conversion units. The fault detection pixels output signals corresponding to the voltage written to the photoelectric conversion unit. Steps S1420 and S1430 can be performed in reverse order.

In step S1440, the photoelectric conversion system 1301 determines whether the actual output values of the fault detection pixels coincide with the expected output values of the fault detection pixels. If, as a result of determination in step S1440, the actual output values are determined to coincide with the expected output values (YES in step S1440), the processing proceeds to step S1450. In step S1450, the photoelectric conversion system 1301 determines that the imaging operation is normally performed. The processing proceeds to step S1460. In step S1460, the photoelectric conversion system 1301 transmits the pixel signals in the scanned row to the memory 1305 to temporarily store the pixel signals therein. Then, the processing returns to step S1420. In step S1420, the photoelectric conversion system 1301 continues the fault detection operation. On the other hand, if, as the result of determination in step S1440, any one of the actual output values is determined to not coincide with the expected output value (NO in step S1440), the processing proceeds to step S1470. In step S1470, the photoelectric conversion system 1301 determines that there is an anomaly in the imaging operation, and issues an alarm to the main control unit 1313 or the alarm device 1312. The alarm device 1312 displays detection of the anomaly on the display unit screen. In step S1480, the photoelectric conversion system 1301 stops the photoelectric conversion apparatuses 1302. The operation of the photoelectric conversion system 1301 ends.

In the present exemplary embodiment, the example where the flowchart is looped for each row has been described. However, the flowchart may be looped in units of a plurality of rows. The fault detection operation may be performed frame by frame. The alarm issued in step S1470 may be notified to outside the vehicle 1300 via a wireless network.

In the present exemplary embodiment, a control for avoiding collision with another vehicle has been described. However, the present exemplary embodiment may be applied to a control for automatically driving the vehicle 1300 to follow another vehicle or a control for automatically driving the vehicle 1300 to not go off the lane. Moreover, the photoelectric conversion system 1301 is applicable not only to a vehicle such as an automobile but also to a moving body (moving apparatus) such as a ship, aircraft, or industrial robot. Not even limited to the moving body, the photoelectric conversion system 1301 is widely applicable to an apparatus using object recognition, such as an intelligent transportation system (ITS).

The photoelectric conversion apparatuses 1302 according to the present exemplary embodiment may be configured to further include a color filter or a microlens, and may be configured to be capable of obtaining various types of information such as distance information. While an amplification transistor constitutes part of a source-follower circuit, the amplification transistor may constitute part of an analog-to-digital (AD) converter. More specifically, the amplification transistor may constitute part of a comparator included in the AD converter. Part of the configuration of the comparator may be located on another semiconductor substrate.

The disclosure is not limited to the foregoing exemplary embodiments, and various modifications may be made thereto. For example, part of the configuration of any one of the exemplary embodiments may be added to another exemplary embodiment or replaced with part of the configuration of another exemplary embodiment. Such modifications may also constitute exemplary embodiments of the disclosure.

All the foregoing exemplary embodiments are merely examples for implementing the disclosure, and the technical scope of the present disclosure should not be interpreted as being limited thereto. In other words, the present disclosure can be implemented in various forms without departing from the technical concept or main features thereof.

According to the exemplary embodiments of the present disclosure, a highly-versatile photoelectric conversion apparatus can be provided.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2019-139134, filed Jul. 29, 2019, which is hereby incorporated by reference herein in its entirety.

What is claimed is:

1. A photoelectric conversion apparatus comprising:
one or more first avalanche diodes;
a first processing circuit configured to be connected to the first avalanche diode(s);
one or more second avalanche diodes; and
a second processing circuit configured to be connected to the second avalanche diode(s),
wherein the first avalanche diode(s) is/are configured to be connected to the second processing circuit by a selection circuit, and
wherein the second avalanche diode(s) is/are configured to be connected to the first processing circuit by the selection circuit.

2. The photoelectric conversion apparatus according to claim 1, wherein the first and second processing circuits each include a counting unit configured to count the signals from the first and second avalanche diodes.

3. The photoelectric conversion apparatus according to claim 2, wherein the selection circuit is configured to select which to input the signal from the first avalanche diode(s) to, the first processing circuit or the second processing circuit, and select which to input the signal from the second avalanche diode(s) to, the first processing circuit or the second processing circuit.

4. The photoelectric conversion apparatus according to claim 3,
wherein the selection circuit includes a first switch and a second switch,
wherein the first switch is configured to control connection and disconnection of the first avalanche diode(s) to/from the first processing circuit, and
wherein the second switch is configured to control connection and disconnection of the first avalanche diode(s) to/from the second processing circuit.

5. The photoelectric conversion apparatus according to claim 4,
wherein the selection circuit includes a third switch and a fourth switch,
wherein the third switch is configured to control connection and disconnection of the second avalanche diode(s) to/from the second processing circuit, and
wherein the fourth switch is configured to control connection and disconnection of the second avalanche diode(s) to/from the first processing circuit.

6. The photoelectric conversion apparatus according to claim 2, wherein the signal from the first avalanche diode(s) is read into the first and second processing circuits.

7. The photoelectric conversion apparatus according to claim 6, wherein the signal from the first avalanche diode(s) is read into the first and second processing circuits in turn.

8. A photoelectric conversion system comprising:
the photoelectric conversion apparatus according to claim 2; and
a signal processing unit configured to process a signal output from the photoelectric conversion apparatus.

9. The photoelectric conversion system according to claim 8, wherein the signal processing unit is configured to perform distance measurement and imaging based on the signal from the photoelectric conversion apparatus.

10. A moving body comprising:
the photoelectric conversion apparatus according to claim 2;
a distance information obtaining unit configured to obtain distance information about a distance to an object by using distance measurement information based on a signal from the photoelectric conversion apparatus; and
a control unit configured to control the moving body based on the distance information.

11. The moving body according to claim 10, wherein imaging is performed based on the signal from the photoelectric conversion apparatus.

12. The photoelectric conversion apparatus according to claim 1, wherein the second avalanche diode(s) is/are in a non-avalanche state in the period where the signal from the first avalanche diode(s) is read into the second processing circuit.

13. The photoelectric conversion apparatus according to claim 12,
wherein a plurality of avalanche diodes including the first and second avalanche diodes is arranged in a plurality of rows,
wherein the first avalanche diode(s) is/are located in an nth (n is an integer) row, and
wherein the second avalanche diode(s) is/are located in an mth (m is an integer other than n) row.

14. The photoelectric conversion apparatus according to claim 1, further comprising:
one or more third avalanche diodes;
a third processing circuit configured to be connected to the third avalanche diode(s);
one or more fourth avalanche diodes; and
a fourth processing circuit configured to be connected to the fourth avalanche diode(s),
wherein the third avalanche diode(s) is/are configured to be connected to the first, second, and fourth processing circuits by the selection circuit, and
wherein the fourth avalanche diode(s) is/are configured to be connected to the first, second, and third processing circuits by the selection circuit.

15. The photoelectric conversion apparatus according to claim 14,
wherein a plurality of avalanche diodes including the first, second, third, and fourth avalanche diodes is arranged in a plurality of rows,
wherein the first and third avalanche diodes are located in an nth (n is an integer) row, and
wherein the second and fourth avalanche diodes are located in an mth (m is an integer other than n) row.

16. The photoelectric conversion apparatus according to claim 15, wherein the second, third, and fourth avalanche diodes are in a non-avalanche state in the period where the signal from the first avalanche diode(s) is read into the second processing circuit.

17. The photoelectric conversion apparatus according to claim 1, further comprising:
a first substrate; and
a second substrate stacked on the first substrate,
wherein the first substrate includes the first and second processing circuits, and
wherein the second substrate includes the first and second avalanche diodes.

18. The photoelectric conversion apparatus according to claim 1, wherein a signal from the second avalanche diode(s) is not input to either of the first and second processing circuits in a period where a signal from the first avalanche diode(s) is read into the second processing circuit.

19. A photoelectric conversion apparatus comprising:
one or more first avalanche diodes;
a first processing circuit configured to be connected to the first avalanche diode(s);
one or more second avalanche diodes; and
a second processing circuit configured to be connected to the second avalanche diode(s),
wherein the first avalanche diode(s) is/are configured to be connected to the second processing circuit by a selection circuit, and
wherein light photoelectrically converted by the first avalanche diode(s) has the same color as that of light photoelectrically converted by the second avalanche diode(s).

20. The photoelectric conversion apparatus according to claim 19,
wherein light incident on the first avalanche diode(s) is light transmitted through a color filter configured to transmit green light, and
wherein light incident on the second avalanche diode(s) is light transmitted through a color filter configured to transmit green light.

21. The photoelectric conversion apparatus according to claim 20, wherein the second avalanche diode(s) is/are in a non-avalanche state in a period where a signal from the first avalanche diode(s) is read into the second processing circuit.

22. A photoelectric conversion apparatus comprising:
one or more first avalanche diodes;
a first processing circuit configured to be connected to the first avalanche diode(s);
one or more second avalanche diodes; and
a second processing circuit configured to be connected to the second avalanche diode(s),
wherein the first avalanche diode(s) is/are configured to be connected to the second processing circuit by a selection circuit, and
wherein a signal from the first avalanche diode(s) is read into the first and second processing circuits in turn.

* * * * *